(12) United States Patent
Kamimura et al.

(10) Patent No.: US 11,712,710 B2
(45) Date of Patent: Aug. 1, 2023

(54) SUBSTRATE PROCESSING APPARATUS AND SUBSTRATE PROCESSING METHOD

(71) Applicant: TOKYO ELECTRON LIMITED, Tokyo (JP)

(72) Inventors: Fumihiro Kamimura, Koshi (JP); Takahisa Otsuka, Koshi (JP); Hiroshi Komiya, Koshi (JP); Nobuhiro Ogata, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 655 days.

(21) Appl. No.: 16/528,757

(22) Filed: Aug. 1, 2019

(65) Prior Publication Data

US 2020/0038897 A1 Feb. 6, 2020

(30) Foreign Application Priority Data

Aug. 2, 2018 (JP) .................. 2018-146231

(51) Int. Cl.
*H01L 21/67* (2006.01)
*B05B 14/30* (2018.01)
*B05B 1/30* (2006.01)

(52) U.S. Cl.
CPC ............ *B05B 14/30* (2018.02); *B05B 1/3093* (2013.01); *H01L 21/6708* (2013.01);
(Continued)

(58) Field of Classification Search
None
See application file for complete search history.

(56) References Cited

U.S. PATENT DOCUMENTS

| 7,647,884 B2 * | 1/2010 | Kwon .................. H01L 21/6715 347/29 |
| 2001/0004878 A1 * | 6/2001 | Sakai ...................... B05C 11/08 134/57 R |

(Continued)

FOREIGN PATENT DOCUMENTS

| JP | 11162817 A | * | 6/1999 |
| JP | 2000-033317 A | | 2/2000 |

(Continued)

*Primary Examiner* — Keath T Chen
*Assistant Examiner* — Margaret Klunk
(74) *Attorney, Agent, or Firm* — Nath, Goldberg & Meyer; Jerald L. Meyer; Tanya E. Harkins

(57) ABSTRACT

A substrate processing apparatus includes: a processing chamber in which a substrate is processed with a processing liquid; a nozzle having a discharge port from which the processing liquid is discharged, the discharge port being formed in a distal end portion of the nozzle; a nozzle bath including an accommodation chamber formed therein, wherein the distal end portion of the nozzle is accommodated in the accommodation chamber at a standby time at which the processing liquid is not supplied to the substrate; a circulation line configured to return the processing liquid, which is discharged from the nozzle to the nozzle bath, to the nozzle; and a first restraint part configured to restrain a gas from flowing between an outside of the nozzle bath and the processing liquid present inside the nozzle bath when the processing liquid discharged from the nozzle to the nozzle bath is circulated to the nozzle.

11 Claims, 14 Drawing Sheets

(52) U.S. Cl.
CPC .... *H01L 21/6715* (2013.01); *H01L 21/67017* (2013.01); *H01L 21/67023* (2013.01); *H01L 21/67051* (2013.01)

(56) References Cited

U.S. PATENT DOCUMENTS

2005/0042807 A1\* 2/2005 Pharand ............ H01L 21/67751
 438/142
2008/0023034 A1\* 1/2008 Hirao .................... B05B 15/557
 134/186
2011/0240601 A1\* 10/2011 Hashizume ....... H01L 21/67051
 156/345.23

FOREIGN PATENT DOCUMENTS

| | | | |
|---|---|---|---|
| JP | 2000033317 A | \* | 2/2000 |
| JP | 2007-149891 A | | 6/2007 |
| JP | 2008-176161 A | | 7/2008 |
| JP | 2011-216607 A | | 10/2011 |
| JP | 2015-220318 A | | 12/2015 |
| WO | WO-2013174716 A1 \* | 11/2013 | ............... B65B 1/28 |

\* cited by examiner t1<t<t2 t2<t<t3

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2018-146231, filed on Aug. 2, 2018, the entire contents of which are incorporated herein by reference.

TECHNICAL FIELD

The present disclosure relates to a substrate processing apparatus and a substrate processing method.

BACKGROUND

The substrate liquid processing apparatus disclosed in Patent Document 1 includes a processing part that processes a substrate with a processing liquid, a storage tank that stores the processing liquid, a circulation line that takes out the processing liquid from the storage tank and returns the same to the storage tank, and a branch line branched from the circulation line to supply the processing liquid to a nozzle of the processing part. The processing liquid is supplied to the substrate from the nozzle of the processing part. After processing the substrate, the processing liquid is collected in a cup and discharged from a liquid discharge line.

RELATED ART DOCUMENT

Patent Documents

Patent Document 1: Japanese Patent Laid-Open Publication No. 2015-220318

SUMMARY

Some embodiments of the present disclosure provide a technique capable of reducing a waste amount of a processing liquid.

According to one embodiment of the present disclosure, there is provided a substrate processing apparatus, including: a processing chamber in which a substrate is processed with a processing liquid; a nozzle having a discharge port from which the processing liquid is discharged, the discharge port being formed in a distal end portion of the nozzle; a nozzle bath including an accommodation chamber formed therein, wherein the distal end portion of the nozzle is accommodated in the accommodation chamber at a standby time at which the processing liquid is not supplied to the substrate; a circulation line configured to return the processing liquid, which is discharged from the nozzle to the nozzle bath, to the nozzle; and a first restraint part configured to restrain a gas from flowing between an outside of the nozzle bath and the processing liquid present inside the nozzle bath when the processing liquid discharged from the nozzle to the nozzle bath is circulated to the nozzle.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
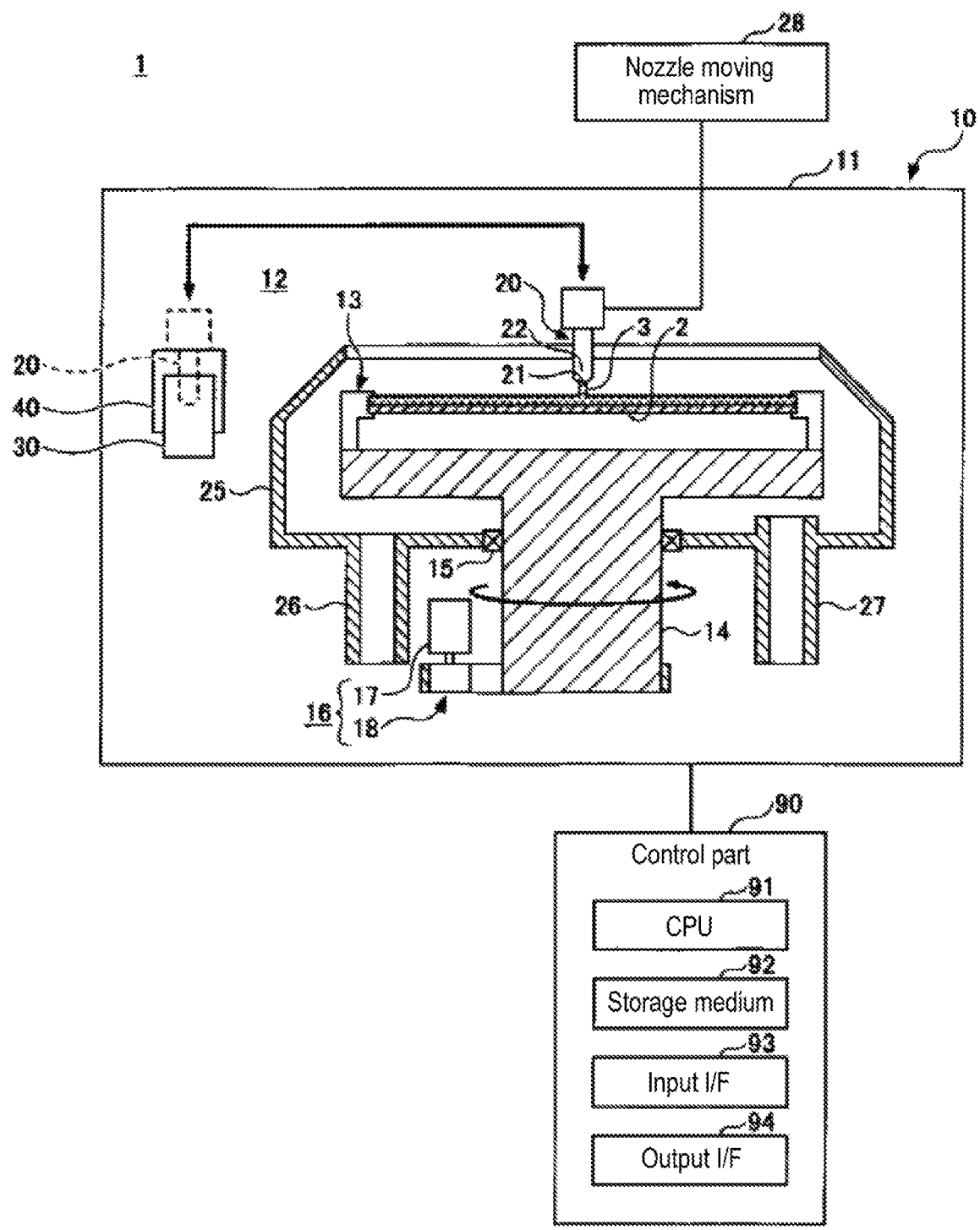
FIG. 1 is a view showing a substrate processing apparatus according to an embodiment.

Hereinafter, embodiments of the present disclosure will be described with reference to the drawings. The same or corresponding components in the drawings are denoted by the same or corresponding reference numerals, and the description thereof may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In the subject specification, the term "downward" refers to downward in the vertical direction, and the term "upward" refers to upward in the vertical direction.

FIG. 1 is a view showing a substrate processing apparatus according to an embodiment. In FIG. 1, the position of the nozzle 20 indicated by a solid line is a processing position, and the position of the nozzle 20 indicated by a broken line is a standby position. The substrate processing apparatus 1 includes, for example, a processing unit 10 and a control part 90.

The processing unit 10 processes a substrate 2 with a processing liquid 3. The substrate 2 is, for example, a semiconductor substrate such as a silicon wafer or the like. A plurality of processing units 10 may be provided for the purpose of processing a plurality of substrates 2 simultaneously.

The processing unit 10 includes, for example, a chamber 11, a substrate holder 13, a rotary drive mechanism 16, a nozzle 20, a cup 25, a nozzle moving mechanism 28, a nozzle bath 30 and an outer bath 40.

The chamber 11 defines a processing chamber 12 in which the substrate 2 is processed by the processing liquid 3. The chamber 11 includes a gate through which the substrate 2 is loaded into the chamber 11 from outside of the chamber 11, and a gate valve for opening and closing the gate. The substrate 2 processed inside the chamber 11 is unloaded out of the chamber 11 through the gate.

The substrate holder 13 holds the substrate 2 loaded into the chamber 11 in a horizontal posture. The substrate holder 13 is a mechanical chuck in FIG. 1 but may be a vacuum chuck or an electrostatic chuck. The substrate holder 13 includes a vertically-disposed rotary shaft portion 14. The rotary shaft portion 14 is rotatably supported by a bearing 15.

The rotary drive mechanism 16 rotates the substrate holder 13. The rotary drive mechanism 16 includes a rotary motor 17 and a transmission mechanism 18 for transmitting the rotary motion of the rotary motor 17 to the rotary shaft portion 14. The transmission mechanism 18 includes, for example, a pulley and a timing belt. The transmission mechanism 18 may be configured by gears or the like.

The nozzle 20 supplies the processing liquid 3 toward the substrate 2 held by the substrate holder 13. The nozzle 20 has a discharge port 21 for the processing liquid 3 at the distal end portion 22 thereof. The nozzle 20 is disposed above the substrate 2 with the discharge port 21 oriented downward.

The nozzle 20 supplies the processing liquid 3 toward the central portion of the substrate 2 which is rotating together with the substrate holder 13. The processing liquid 3 supplied to the central portion of the rotating substrate 2 soaks and spreads over the entire upper surface of the substrate 2 by virtue of a centrifugal force and is dropped from the outer peripheral edge of the substrate 2. Droplets of the dropped processing liquid 3 are collected in the cup 25.

The cup 25 collects the processing liquid 3 supplied to the substrate 2. The cup 25 holds the bearing 15 for rotatably supporting the substrate holder 13 and does not rotate together with the substrate holder 13. A drainage pipe 26 and an exhaust pipe 27 are provided at the bottom of the cup 25. The drainage pipe 26 discharges the liquid staying inside the cup 25, and the exhaust pipe 27 discharges the gas present inside the cup 25.

The nozzle 20 may supply the processing liquid 3 corresponding to a processing step of the substrate 2. For the purpose of supplying a plurality of processing liquids 3 to the substrate 2, a plurality of nozzles 20 may be provided. The processing liquid 3 discharged by the nozzle 20 is a chemical liquid, a rinsing liquid or a drying liquid.

The chemical liquid is not particularly limited and may be, for example, DHF (dilute hydrofluoric acid), SC-1 (aqueous solution containing ammonium hydroxide and hydrogen peroxide), SC-2 (aqueous solution containing hydrogen chloride and hydrogen peroxide) or the like. The chemical liquid may be alkaline or acidic.

The rinsing liquid is not particularly limited and may be, for example, DIW (deionized water). The rinsing liquid is used after using the chemical liquid. A liquid film of the chemical solution previously formed on the substrate 2 is replaced by a liquid film of the rinsing liquid.

The drying liquid is not particularly limited and may be, for example, IPA (isopropyl alcohol). The drying liquid is used after using the rinsing liquid. The liquid film of the rinsing liquid previously formed on the substrate 2 is replaced by a liquid film of the drying liquid.

The nozzle moving mechanism 28 moves the nozzle 20 between the processing position (the position indicated by the solid line in FIG. 1) at which the supply of the processing liquid 3 toward the substrate 2 held by the substrate holder 13 is performed and the standby position (the position indicated by the broken line in FIG. 1) at which the supply of the processing liquid 3 toward the substrate 2 is interrupted. The processing position is set, for example, directly above the central portion of the substrate 2. On the other hand, the standby position is set outside the cup 25.

Figure 2:
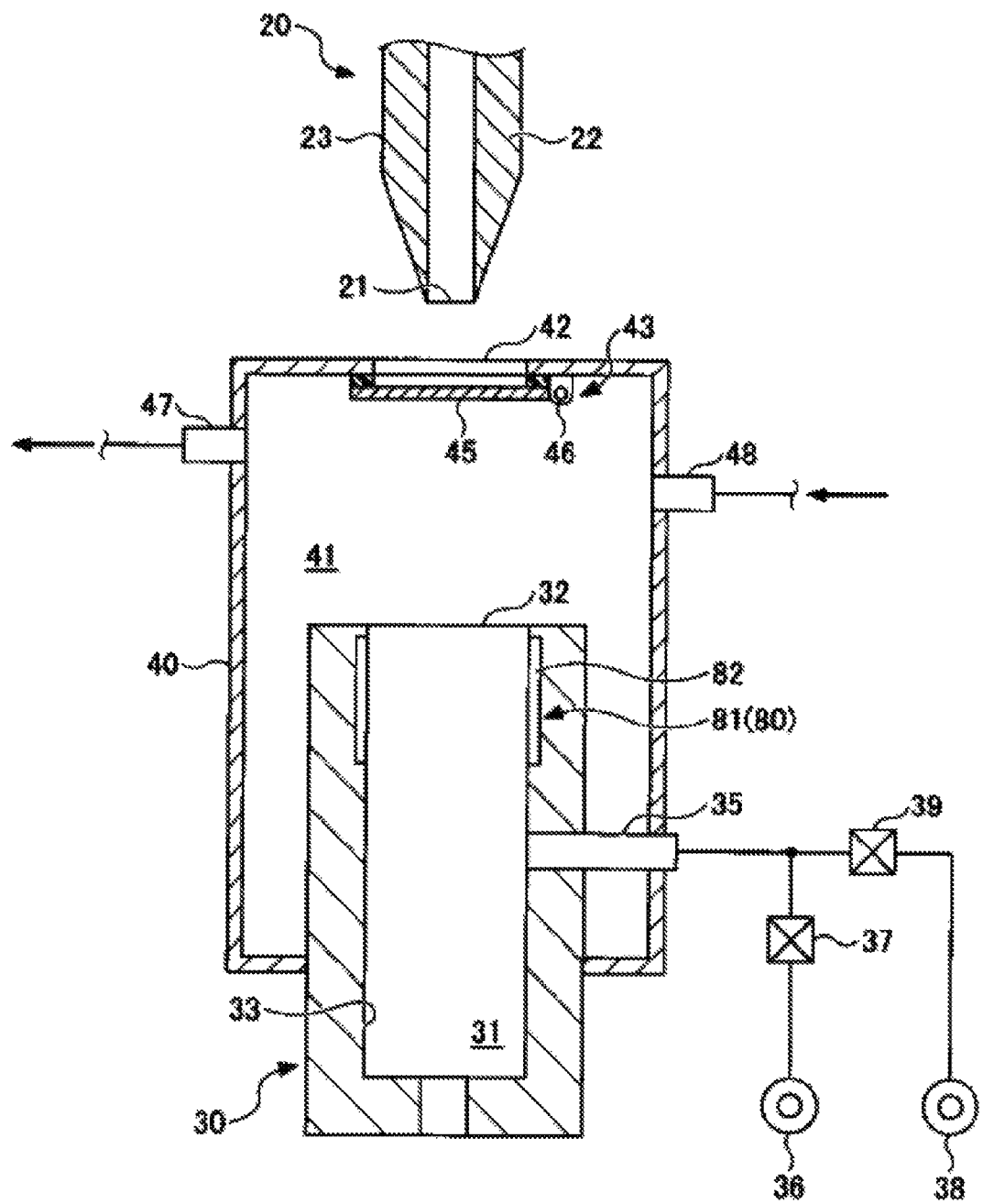
FIG. 2 is a view showing a nozzle bath and an outer bath according to an embodiment, which shows a state before a nozzle is accommodated in an accommodation chamber of the nozzle bath.
Figure 3:
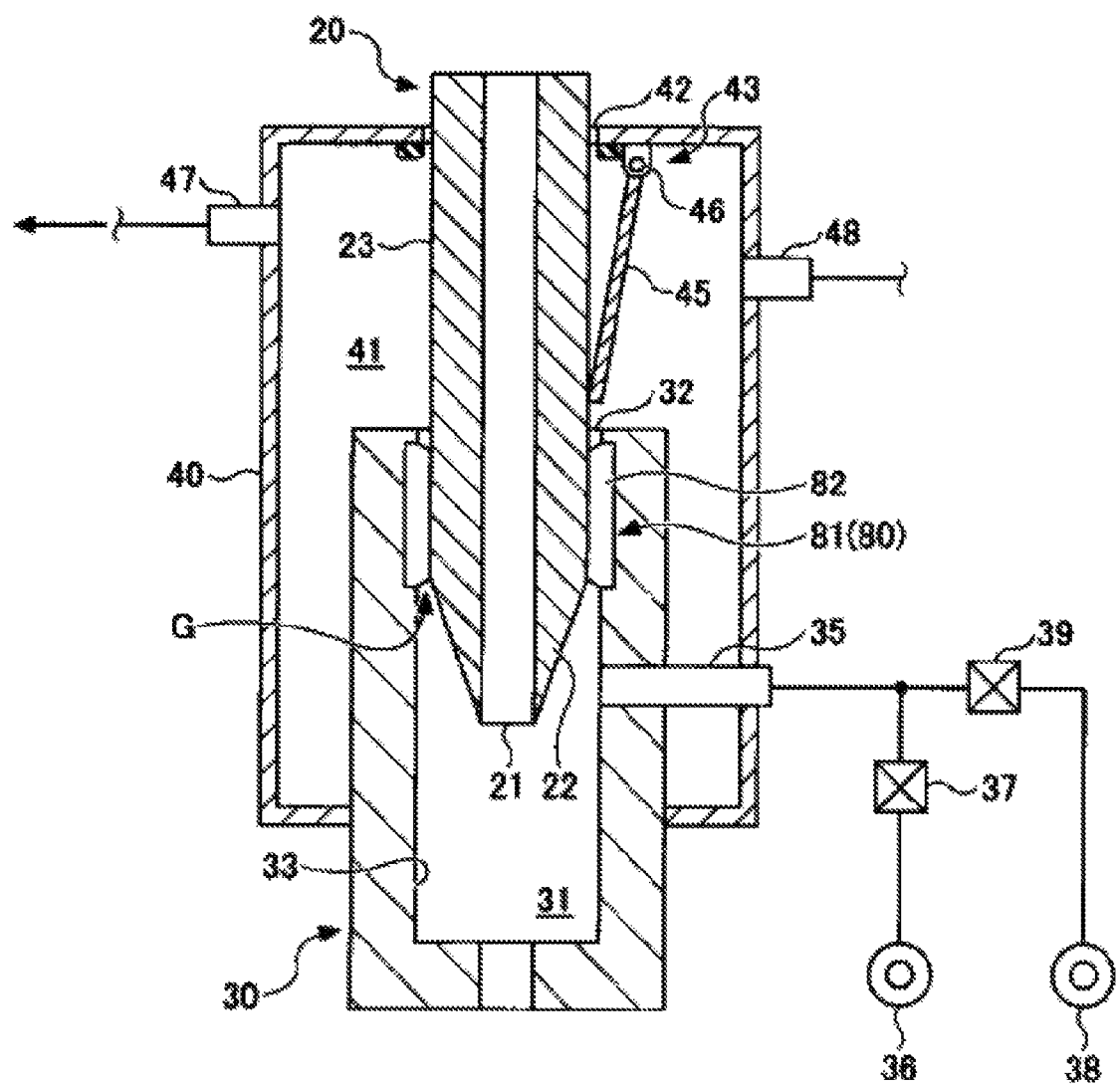
FIG. 3 is a view showing the nozzle bath and the outer bath according to an embodiment, which shows a state after the nozzle is accommodated in the accommodation chamber of the nozzle bath.

FIG. 2 is a view showing a nozzle bath and an outer bath according to an embodiment, which shows a state before the nozzle is accommodated in an accommodation chamber of the nozzle bath. FIG. 3 is a view showing the nozzle bath and the outer bath according to an embodiment, which shows a state after the nozzle is accommodated in the accommodation chamber of the nozzle bath.

The nozzle bath 30 internally defines an accommodation chamber 31 in which the distal end portion 22 of the nozzle 20 is accommodated at a standby time at which the supply of the processing liquid 3 toward the substrate 2 is interrupted. The processing chamber 12 is formed outside the nozzle bath 30. In addition to the processing chamber 12, an intermediate chamber 41 described later may be formed outside the nozzle bath 30. The nozzle bath 30 has an entrance 32 through which the distal end portion 22 of the nozzle 20 is inserted and pulled out.

In the course of moving the nozzle 20 from the processing position to the standby position, the distal end portion 22 of the nozzle 20 is inserted from the outside of the nozzle bath 30 into the inside of the nozzle bath 30 via the entrance 32 of the nozzle bath 30. On the other hand, in the course of moving the nozzle 20 from the standby position to the processing position, the distal end portion 22 of the nozzle 20 is pulled out from the inside of the nozzle bath 30 to the outside of the nozzle bath 30 via the entrance 32 of the nozzle bath 30.

A cleaning nozzle 35 for cleaning the distal end portion 22 of the nozzle 20 is provided in the nozzle bath 30. The cleaning nozzle 35 is coupled to a supply source 36 of a cleaning liquid such as DIW or the like via an opening/closing valve 37. When the opening/closing valve 37 opens a flow path of the cleaning liquid, the cleaning nozzle 35 supplies the cleaning liquid toward the distal end portion 22 of the nozzle 20. Foreign substances adhering to the distal end portion 22 of the nozzle 20 can be washed away with the cleaning liquid. The foreign substances are discarded outward of a tank 50 (to be described later) through a waste liquid line 75 (to be described later) together with the cleaning liquid.

The cleaning nozzle 35 may be coupled to a supply source 38 of a drying gas such as a nitrogen gas or the like via an opening/closing valve 39. When the opening/closing valve 39 opens a flow path of the drying gas, the cleaning nozzle 35 supplies the drying gas toward the distal end portion 22 of the nozzle 20. Droplets of the cleaning liquid adhering to the distal end portion 22 of the nozzle 20 can be blown off.

The outer bath 40 is disposed outside the nozzle bath 30 to internally define the intermediate chamber 41 that surrounds the entrance 32 of the nozzle bath 30. The processing chamber 12 is formed outside the outer bath 40. The outer bath 40 has an entrance 42 through which the distal end portion 22 of the nozzle 20 is inserted and pulled out.

In the course of moving the nozzle 20 from the processing position to the standby position, the distal end portion 22 of the nozzle 20 is inserted from the outside of the outer bath 40 into the inside of the outer bath 40 via the entrance 42 of the outer bath 40. Subsequently, the distal end portion 22 of the nozzle 20 is inserted from the outside of the nozzle bath 30 into the inside of the nozzle bath 30 via the entrance 32 of the nozzle bath 30.

On the other hand, in the course of moving the nozzle 20 from the standby position to the processing position, the distal end portion 22 of the nozzle 20 is pulled out from the inside of the nozzle bath 30 outward of the nozzle bath 30 via the entrance 32 of the nozzle bath 30. Subsequently, the distal end portion 22 of the nozzle 20 is pulled out from the inside of the outer bath 40 outward of the outer bath 40 through the entrance 42 of the outer bath 40.

Figure 4:
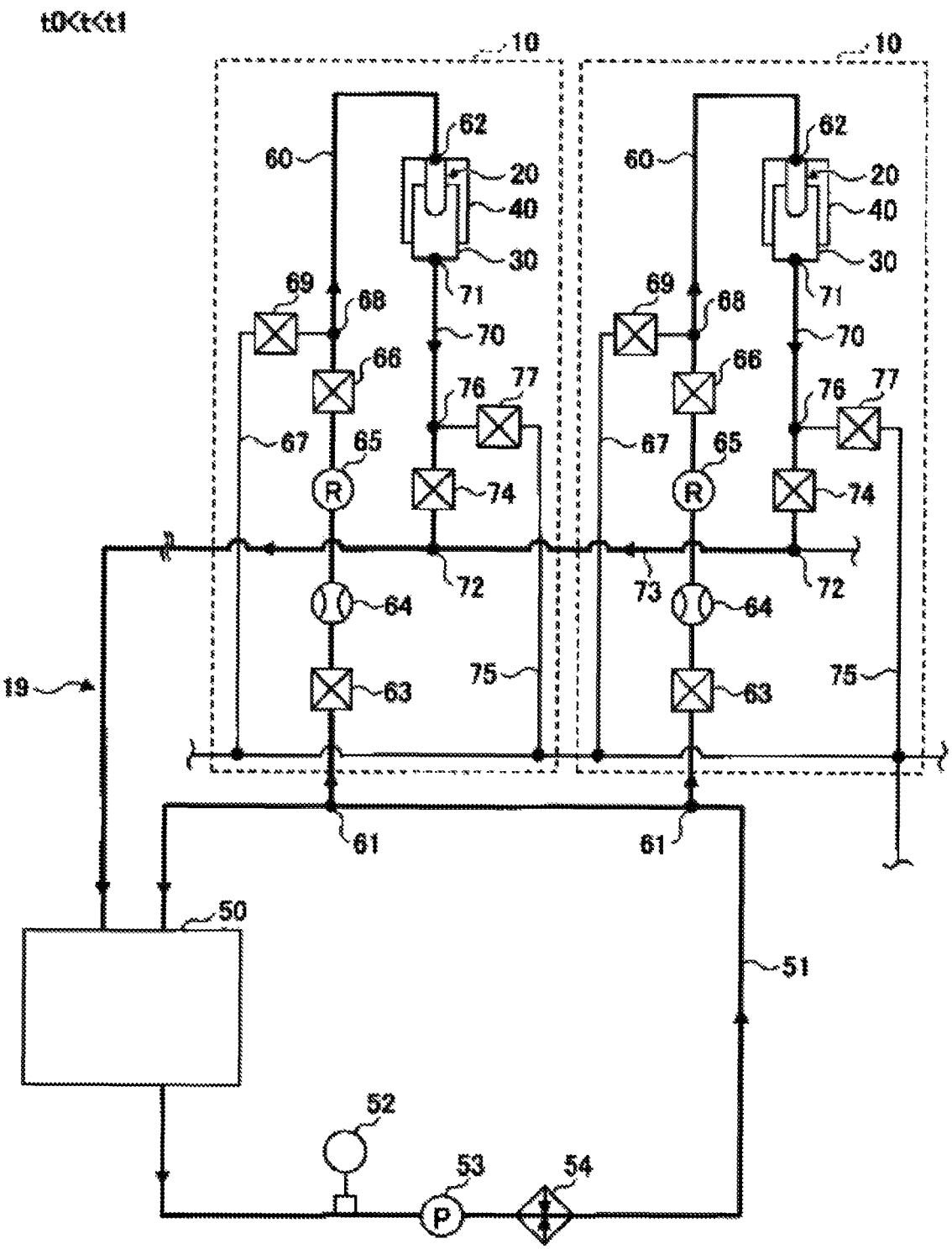
FIG. 4 is a view showing a flow path of a processing liquid in the substrate processing apparatus according to an embodiment.
Figure 6:
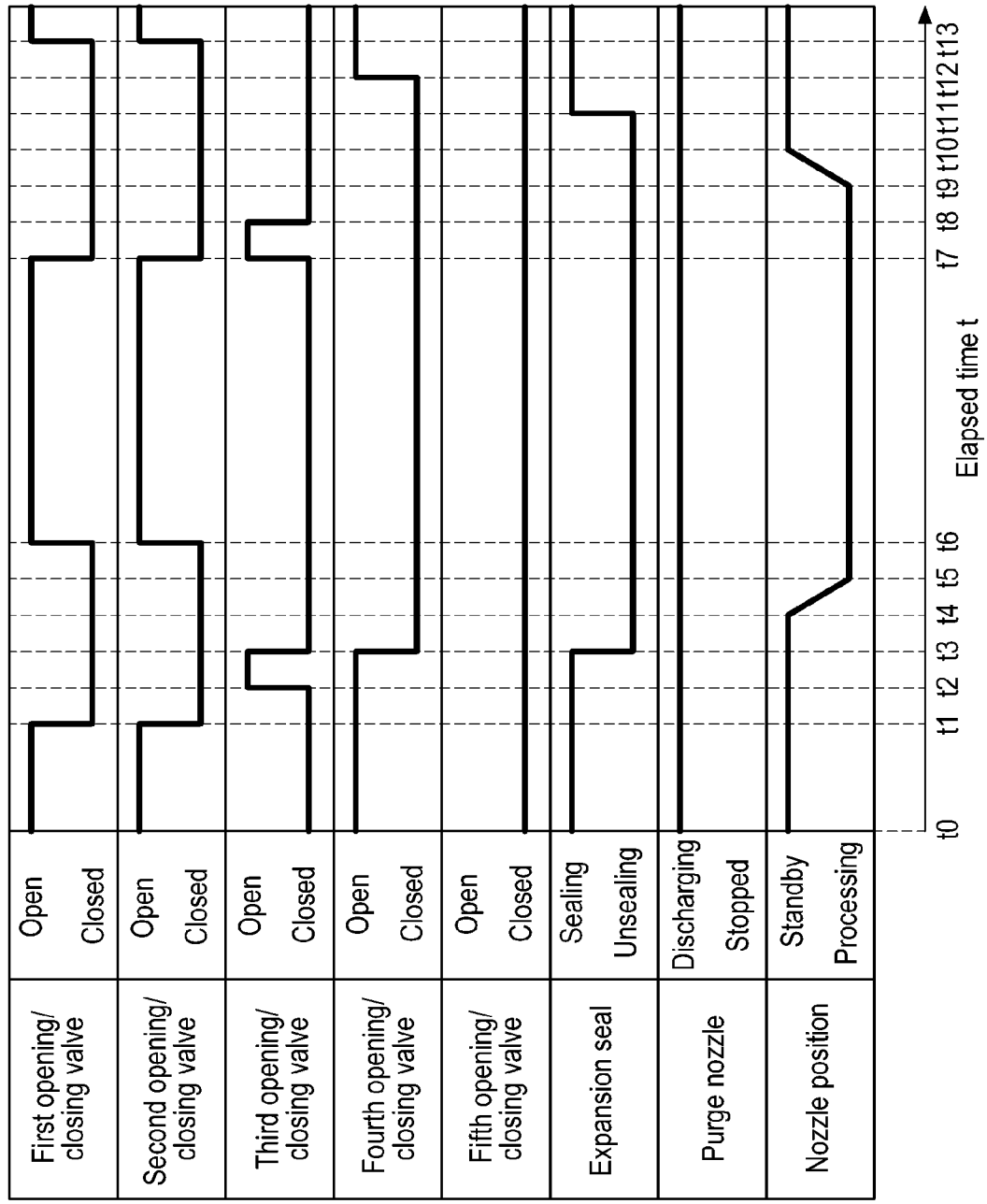
FIG. 6 is a timing chart showing the operation of the substrate processing apparatus according to an embodiment.

FIG. 4 is a view showing the flow path of the processing liquid in the substrate processing apparatus 1 according to one embodiment. In FIG. 4, the flow of the processing liquid 3 from time t0 to time t1 shown in FIG. 6 is indicated by thick lines and arrows. The substrate processing apparatus 1 includes a tank 50 for storing the processing liquid 3 and a first circulation line 51 through which the processing liquid 3 taken out of the tank 50 returns to the tank 50. One tank 50 stores one processing liquid 3. The tank 50 is provided for each of the processing liquids 3.

A thermometer 52 for detecting a temperature of the processing liquid 3, a pump 53 for feeding the processing liquid 3 and a temperature adjustor 54 for adjusting the temperature of the processing liquid 3 are provided in the first circulation line 51. The temperature adjustor 54 includes a heater for heating the processing liquid 3. The temperature adjustor 54 heats the processing liquid 3 under the control of the control part 90 so that the temperature detected by the thermometer 52 becomes a set temperature. The temperature adjustor 54 may include a cooler for cooling the processing liquid 3. The thermometer 52 is provided at the upstream side with reference to the temperature adjustor 54 in FIG. 4. However, the thermometer 52 may be provided at the downstream side, or two thermometers may be provided at the upstream side and the downstream side.

Although the processing liquid 3 processes the substrate 2 at a high temperature in the present embodiment, the substrate 2 may be processed at room temperature. In the latter case, the thermometer 52 and the temperature adjustor 54 may be omitted.

The substrate processing apparatus 1 includes a supply line 60 through which the processing liquid 3 supplied from the tank 50 is supplied to the nozzle 20. An upstream end 61 of the supply line 60 is coupled to the first circulation line 51, and a downstream end 62 of the supply line 60 is coupled to the nozzle 20. The supply line 60 is provided for each processing unit 10.

A first opening/closing valve 63, a flow meter 64, a flow rate regulation valve 65 and a second opening/closing valve 66 are provided in the supply line 60 in the named order from the upstream side to the downstream side. The first opening/closing valve 63 and the second opening/closing valve 66 open and close the flow path of the processing liquid 3. The flow meter 64 detects a flow rate of the processing liquid 3. The flow rate regulation valve 65 regulates the flow rate of the processing liquid 3 under the control of the control part 90 so that the flow rate detected by the flow meter 64 becomes a set flow rate.

A waste liquid line 67 through which the processing liquid 3 staying between the second opening/closing valve 66 and the nozzle 20 is discharged is coupled to the supply line 60. An upstream end 68 of the waste liquid line 67 is coupled to the supply line 60 between the second opening/closing valve 66 and the nozzle 20. A third opening/closing valve 69 for opening and closing the flow path of the processing liquid 3 is provided in the waste liquid line 67. The processing liquid 3 having passed through the third opening/closing valve 69 is discarded outward of the tank 50 without being returned to the tank 50.

The substrate processing apparatus 1 includes a recovery line 70 through which the processing liquid 3 discharged by the distal end portion 22 of the nozzle 20 inside the nozzle bath 30 returns from the nozzle bath 30 to the tank 50. An upstream end 71 of the recovery line 70 is coupled to the nozzle bath 30, and a downstream end 72 of the recovery line 70 is coupled to a common recovery line 73. The recovery line 70 is provided for each processing unit 10. The processing liquid 3 supplied from a plurality of recovery lines 70 is returned to the tank 50 through the common recovery line 73.

A fourth opening/closing valve 74 for opening and closing the flow path of the processing liquid 3 is provided in the recovery line 70. Furthermore, a waste liquid line 75 through which the processing liquid 3 staying between the fourth opening/closing valve 74 and the nozzle bath 30 is discharged is coupled to the recovery line 70. An upstream end 76 of the waste liquid line 75 is coupled to the recovery line 70 between the fourth opening/closing valve 74 and the nozzle bath 30. A fifth opening/closing valve 77 for opening and closing the flow path of the processing liquid 3 is provided in the waste liquid line 75. The processing liquid 3 having passed through the fifth opening/closing valve 77 is discarded outward of the tank 50 without being returned to the tank 50.

As indicated by thick lines and arrows in FIG. 4, a combination of the recovery line 70, the common recovery line 73, the tank 50, the first circulation line 51 and the supply line 60 constitutes a second circulation line 19 through which the processing liquid 3 discharged from the nozzle 20 to the nozzle bath 30 is returned to the nozzle 20. In the present embodiment, the second circulation line 19 corresponds to a circulation line recited in the claims. The configuration of the second circulation line 19 is not limited to that shown in FIG. 4. For example, the second circulation line 19 may be any line as long as it can return the processing liquid 3, which is discharged from the nozzle 20 to the nozzle bath 30, to the nozzle 20 without passing through the tank 50. When the second circulation line 19 is formed, as shown in FIG. 3, a gap G is formed between the nozzle bath 30 and the nozzle 20 accommodated in the accommodation chamber 31 of the nozzle bath 30. The gap G is formed between an outer circumferential surface 23 of the nozzle 20 and an inner circumferential surface 33 of the nozzle bath 30.

The substrate processing apparatus 1 includes a first restraint part 80 for restraining a gas from flowing between the outside of the nozzle bath 30 and the processing liquid 3 present inside the nozzle bath 30 during the circulation of the processing liquid 3. The circulation of the processing liquid 3 means that the processing liquid 3 discharged from the nozzle 20 to the nozzle bath 30 is returned back to the nozzle 20. The first restraint part 80 restrains the gas present outside the nozzle bath 30 from flowing to the distal end portion 22 of the nozzle 20 accommodated in the accommodation chamber 31 of the nozzle bath 30. The first restraint part 80 restrains the gas present outside the nozzle bath 30 from making contact with the processing liquid 3 present inside the nozzle bath 30. The first restraint part 80 restrains vapor of the processing liquid 3 present inside the nozzle bath 30 from leaking out of the nozzle bath 30.

The first restraint part 80 includes a sealing part 81 that seals the gap G when circulating the processing liquid 3. By sealing the gap G, the sealing part 81 restrains the gas present outside the nozzle bath 30 from flowing to the distal end portion 22 of the nozzle 20 accommodated in the accommodation chamber 31 of the nozzle bath 30. By sealing the gap G, the sealing part 81 restrains the gas present outside the nozzle bath 30 from making contact with the processing liquid 3 present inside the nozzle bath 30. By sealing the gap G, the sealing part 81 restrains vapor of the processing liquid 3 present inside the nozzle bath 30 from leaking out of the nozzle bath 30.

By restraining the gas present outside the nozzle bath 30 from flowing to the distal end portion 22 of the nozzle 20 accommodated in the accommodation chamber 31 of the nozzle bath 30, it is possible to suppress generation of crystals at the distal end portion 22 of the nozzle 20. The crystals may be generated, for example, by the neutralization reaction between an alkaline chemical solution and vapor of an acidic chemical solution used outside the nozzle bath 30 when the nozzle 20 discharges the alkaline chemical solution. In addition, when the nozzle 20 discharges an acidic chemical solution, the crystals may be generated by the neutralization reaction between the acidic chemical solution and vapor of the alkaline chemical solution used outside the nozzle bath 30. According to the present embodiment, since the generation of crystals at the distal end portion 22 of the nozzle 20 can be suppressed, it is possible to suppress the mixing of crystals into the processing liquid 3 discharged from the nozzle 20 to the nozzle bath 30. Accordingly, the processing liquid 3 can be circulated without being discarded.

By restraining the gas present outside the nozzle bath 30 from making contact with the processing liquid 3 present inside the nozzle bath 30, it is possible to suppress a change in component of the processing liquid 3 to be returned to the tank 50 and to suppress processing defects of the substrate 2 processed by the processing liquid 3 supplied from the tank 50. The change in component of the processing liquid 3 is caused, for example, by at least one of the volatilization of volatile components and the chemical reaction with an ambient air. For example, in a case where the processing liquid 3 present inside the nozzle bath 30 is an alkaline chemical silicon, when the alkaline chemical solution makes contact with the vapor of the acidic chemical solution entering from the outside of the nozzle bath 30, crystals are generated by a neutralization reaction, whereby the component of the alkaline chemical solution (e.g., the concentration of a solute) is changed. Similarly, in a case where the processing liquid 3 present inside the nozzle bath 30 is an acidic chemical solution, when the acidic chemical solution makes contact with the vapor of an alkaline chemical solution entering from the outside of the nozzle bath 30, crystals are generated by a neutralization reaction, whereby the component of the acidic chemical solution (e.g., the concentration of a solute) is changed.

By restraining the vapor of the processing liquid 3 present inside the nozzle bath 30 from leaking out of the nozzle bath 30, it is possible to suppress the contamination of the atmosphere in the processing chamber 12, to suppress generation of crystals due to the reaction between the vapors of the plural types of processing liquids 3, and to suppress adhesion of crystals to the substrate 2. As used herein, the expression "the reaction between the vapors of the plural types of processing liquids 3" may refer to, for example, the reaction between the vapor of the alkaline chemical solution and the vapor of the acidic chemical solution.

The sealing part 81 includes an expansion seal 82 that expands by fluid supplied thereinto to seal the gap G. As the fluid supplied into the expansion seal 82, a gas such as air or the like or a liquid such as water or the like may be used. The expansion seal 82 is contracted by discharging the fluid therefrom to release the sealing of the gap G.

The expansion seal 82 is formed, for example, in a ring shape, and is configured to seal the cylindrical gap G formed between the inner circumferential surface 33 of the nozzle bath 30 and the outer circumferential surface 23 of the nozzle 20. The expansion seal 82 is fixed to the inner circumferential surface 33 of the nozzle bath 30 and is pressed against the outer circumferential surface 23 of the nozzle 20 by expanding radially inward.

In addition, as the fluid is discharged from the inside of the expansion seal 82, the expansion seal 82 is contracted and separated from the outer circumferential surface 23 of the nozzle 20, thereby releasing the sealing of the gap G of the nozzle 20. The expansion seal 82 can be released from the nozzle 20 before the start of movement of the nozzle 20 from the standby position to the processing position. This makes it possible to prevent friction between the nozzle 20 and the expansion seal 82 at the time of moving the nozzle 20, thereby suppressing generation of particles.

The substrate processing apparatus 1 has a second restraint part 43 for restraining a gas from flowing between the outside of the outer bath 40 and the inside of the nozzle bath 30. The second restraint part 43 restrains the gas present outside the outer bath 40 from flowing to the distal end portion 22 of the nozzle 20 accommodated in the accommodation chamber 31 of the nozzle bath 30. The second restraint part 43 restrains the gas from entering from the outside of the outer bath 40 into the inside of the nozzle bath 30. The second restraint part 43 restrains the gas from flowing from the inside of the nozzle bath 30 to the outside of the outer bath 40.

By restraining the gas present outside the outer bath 40 from flowing to the distal end portion 22 of the nozzle 20 accommodated in the accommodation chamber 31 of the nozzle bath 30, it is possible to suppress generation of crystals at the distal end portion 22 of the nozzle 20. As a result, it is possible to suppress the mixing of crystals into the processing liquid 3 discharged from the nozzle 20 to the nozzle bath 30. Accordingly, the processing liquid 3 can be circulated without being discarded.

By restraining the gas from entering from the outside of the outer bath 40 into the inside of the nozzle bath 30, it is possible to restrain the gas present outside the outer bath 40 from making contact with the processing liquid 3 present inside the nozzle bath 30. As a result, it is possible to suppress a change in component of the processing liquid 3 to be returned to the tank 50 and to suppress processing defects of the substrate 2 processed by the processing liquid 3 supplied from the tank 50.

By restraining the gas from flowing from the inside of the nozzle bath 30 to the outside of the outer bath 40, it is possible to restrain the vapor of the processing liquid 3 present inside the nozzle bath 30 from leaking out of the outer bath 40. Accordingly, it is possible to suppress the contamination of the atmosphere in the processing chamber 12, to suppress generation of crystals due to the reaction between the vapors of plural types of processing liquids 3, and to suppress adhesion of the crystals to the substrate 2.

The second restraint part 43 includes a movable lid 45 for opening and closing the entrance 42 of the outer bath 40. The movable lid 45 is movably attached to the outer bath 40 by, for example, a hinge or the like. When the distal end portion 22 of the nozzle 20 is inserted from the outside of the outer bath 40 into the inside of the outer bath 40 through the entrance 42 of the outer bath 40, the movable lid 45 opens the entrance 42 of the outer bath 40.

When the distal end portion 22 of the nozzle 20 is pulled out from the inside of the outer bath 40 to the outside of the outer bath 40 through the entrance 42 of the outer bath 40, the movable lid 45 closes the entrance 42 of the outer bath 40. The movable lid 45 closes the entrance 42 of the outer bath 40 to restrain the gas present outside the outer bath 40 from flowing to the distal end portion 22 of the nozzle 20 accommodated in the accommodation chamber 31 of the nozzle bath 30. The movable lid 45 closes the entrance 42 of the outer bath 40 to restrain the gas from entering from the outside of the outer bath 40 into the inside of the nozzle bath 30. The movable lid 45 restrains the gas from flowing from the inside of the nozzle bath 30 to the outside of the outer bath 40.

The second restraint part 43 includes a spring 46 that biases the movable lid 45 from an open position at which the entrance 42 of the outer bath 40 is opened toward a closed position at which the entrance 42 of the outer bath 40 is closed. When the distal end portion 22 of the nozzle 20 is pulled out from the inside of the outer bath 40 to the outside of the outer bath 40 through the entrance 42 of the outer bath 40, the movable lid 45 can be moved from the open position to the closed position by virtue of a restoration force of the spring 46. When the distal end portion 22 of the nozzle 20 is inserted from the outside of the outer bath 40 into the inside of the outer bath 40 through the entrance 42 of the outer bath 40, the distal end portion 22 presses the movable lid 45 from the closed position to the open position against the restoration force of the spring 46.

The second restraint part 43 includes a suction nozzle 47 for discharging a gas from the intermediate chamber 41 outward of the processing chamber 12. The suction nozzle 47 expels the gas flowing into the intermediate chamber 41 from the entrance 42 of the outer bath 40 and the entrance 32 of the nozzle bath 30 outward of the processing chamber 12. With this configuration, the gas present outside the outer bath 40 is restrained from flowing to the distal end portion 22 of the nozzle 20 accommodated in the accommodation chamber 31 of the nozzle bath 30; the gas is restrained from entering from the outside of the outer bath 40 inward of the nozzle bath 30; and the gas is restrained from flowing from the inside of the nozzle bath 30 outward of the outer bath 40. The suction nozzle 47 may discharge the gas from the intermediate chamber 41 outward of the processing chamber 12 regardless of the position of the nozzle 20.

The second restraint part 43 includes a purge nozzle 48 that supplies a purge gas into the intermediate chamber 41 from the outside of the processing chamber 12. As the purge gas discharged by the purge nozzle 48, for example, an inert gas such as a nitrogen gas or the like is used. Air or the like may be used instead of the inert gas. The purge gas may be any gas that does not react with the vapor of the processing liquid 3 present inside the nozzle bath 30. The purge gas is sucked by the suction nozzle 47 and discharged outward of the processing chamber 12.

The purge nozzle 48 supplies the purge gas from the outside of the processing chamber 12 into the intermediate chamber 41 when the suction nozzle 47 sucks a gas from the intermediate chamber 41 outward of the processing chamber 12. Since the drop in the air pressure in the intermediate chamber 41 can be restrained, it is possible to restrain the gas from entering from the processing chamber 12 into the intermediate chamber 41 and to keep clean the internal atmosphere of the intermediate chamber 41.

The purge nozzle 48 and the suction nozzle 47 may be operated as a set. Both the purge nozzle 48 and the suction nozzle 47 may be operated simultaneously and may be stopped simultaneously.

The control part 90 (see FIG. 1) is configured by, for example, a computer, and includes a CPU (Central Processing Unit) 91 and a storage medium 92 such as a memory or the like. The storage medium 92 stores a program for controlling various processes performed in the substrate processing apparatus 1. The control part 90 controls the operation of the substrate processing apparatus 1 by causing the CPU 91 to execute the program stored in the storage medium 92. The control part 90 further includes an input interface (I/F) 93 and an output interface (I/F) 94. The control part 90 receives an external signal at the input interface 93 and transmits a signal to the outside at the output interface 94.

Such a program may be stored in a non-transitory computer-readable storage medium and may be installed from the storage medium on the storage medium 92 of the control part 90. Examples of the computer-readable storage medium include a hard disk (HD), a flexible disk (FD), a compact disk (CD), a magneto-optical desk (MO), a memory card and the like. The program may be downloaded from a server via the Internet and may be installed on the storage medium 92 of the control part 90.

Figure 5:
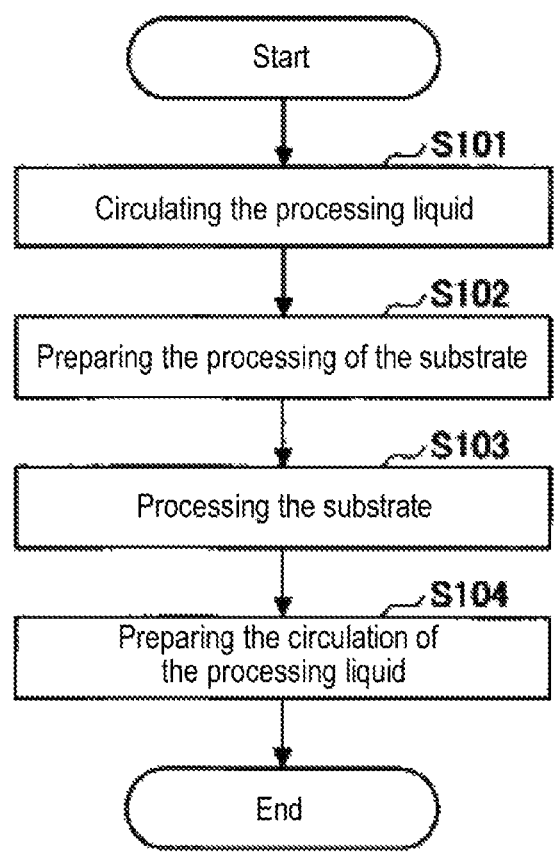
FIG. 5 is a flowchart illustrating a substrate processing method according to an embodiment.
Figure 7:
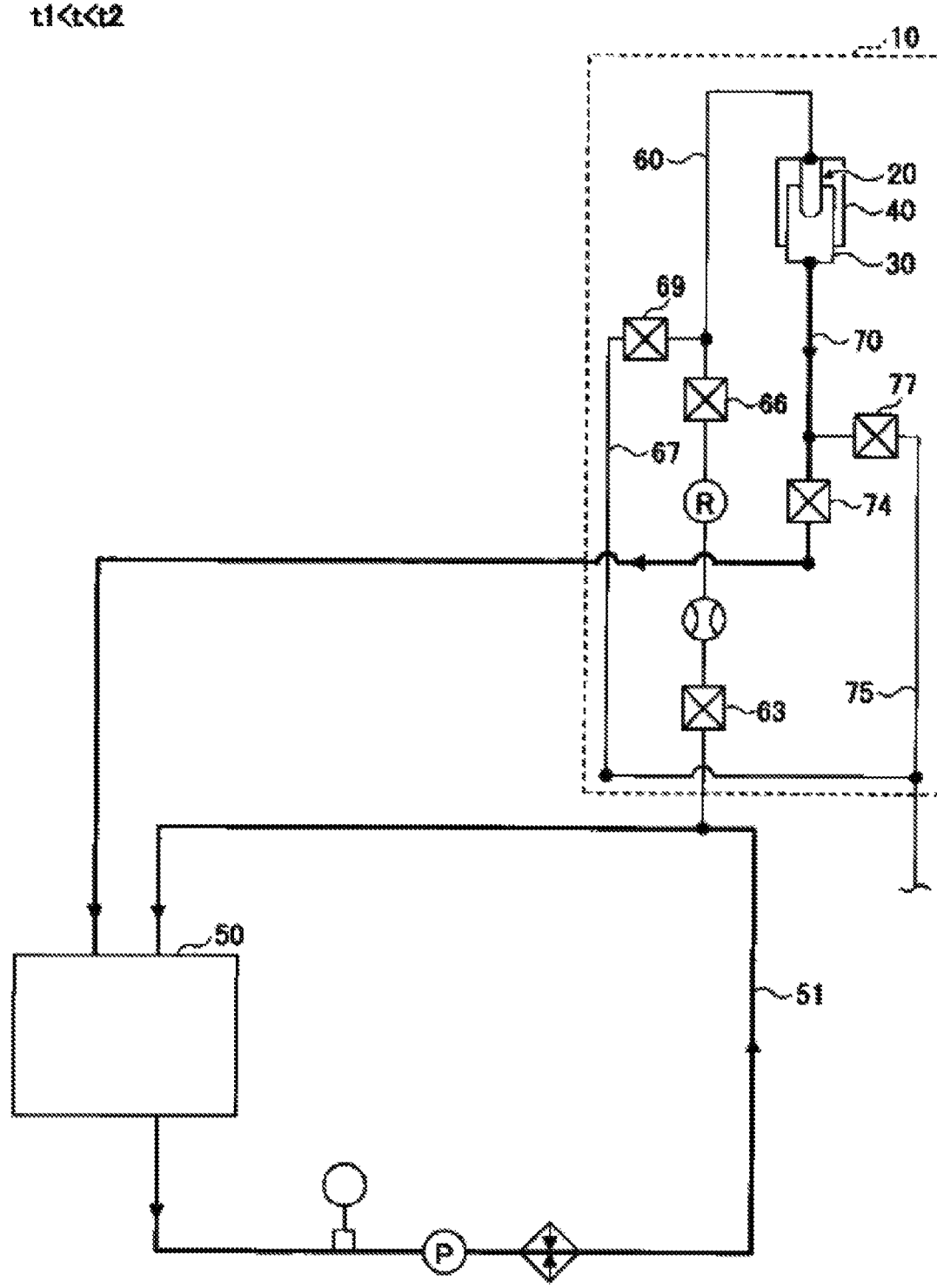
FIG. 7 is a view showing, by thick lines and arrows, the flow of the processing liquid after time t1 and before time t2 in FIG. 6 according to an embodiment.
Figure 8:
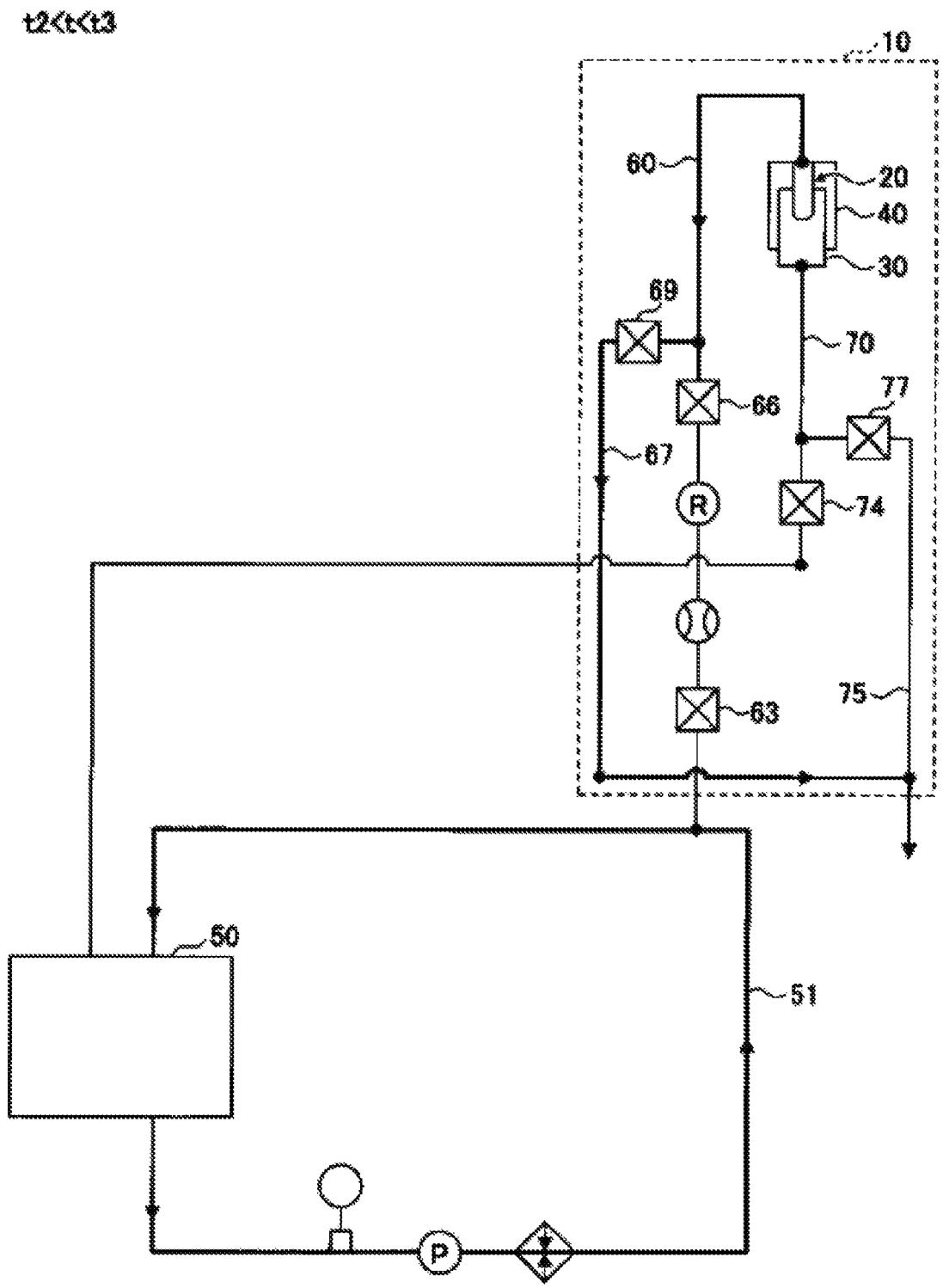
FIG. 8 is a view showing, by thick lines and arrows, the flow of the processing liquid after time t2 and before time t3 in FIG. 6 according to an embodiment.
Figure 9:
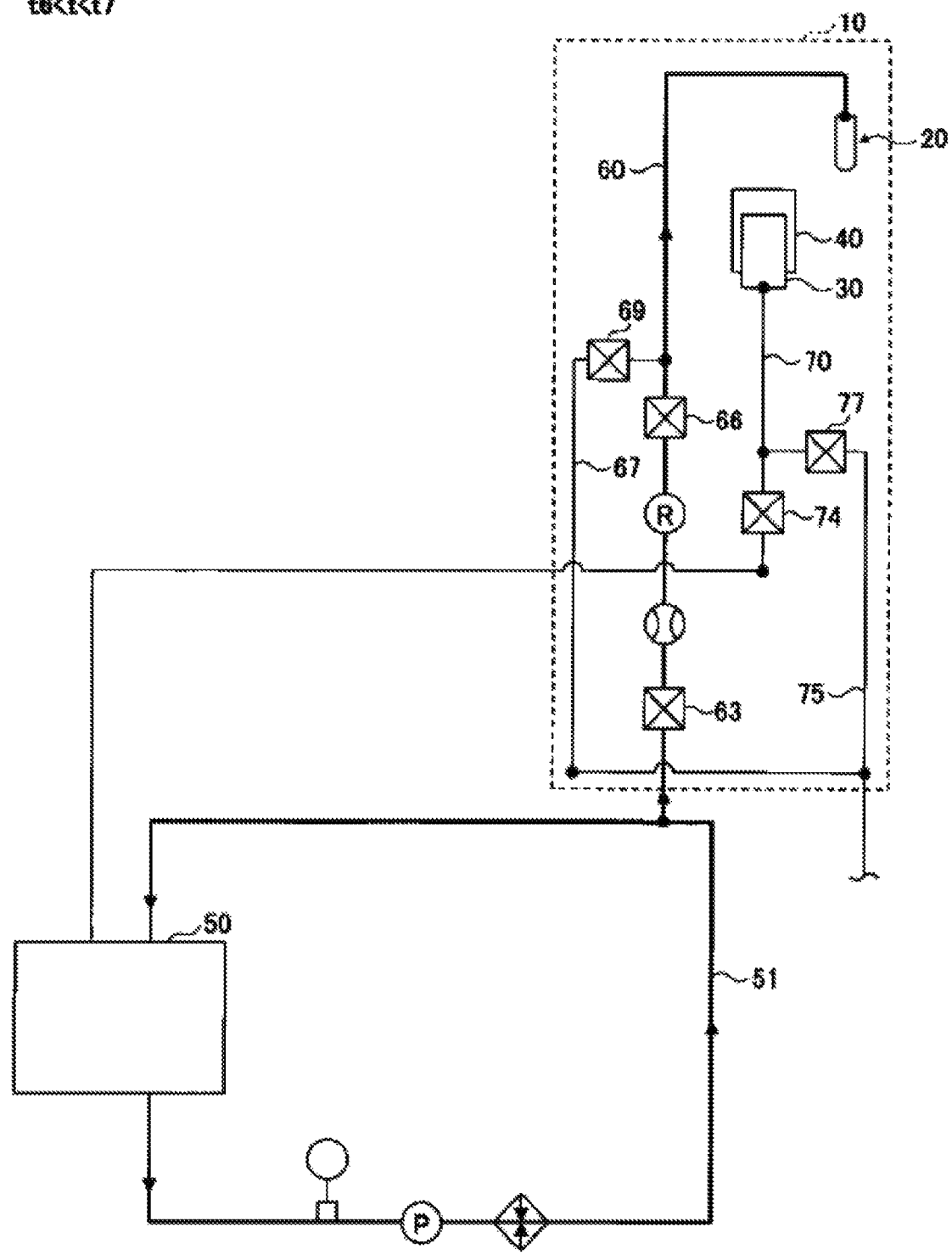
FIG. 9 is a view showing, by thick lines and arrows, the flow of the processing liquid after time t6 and before time t7 in FIG. 6 according to an embodiment.
Figure 10:
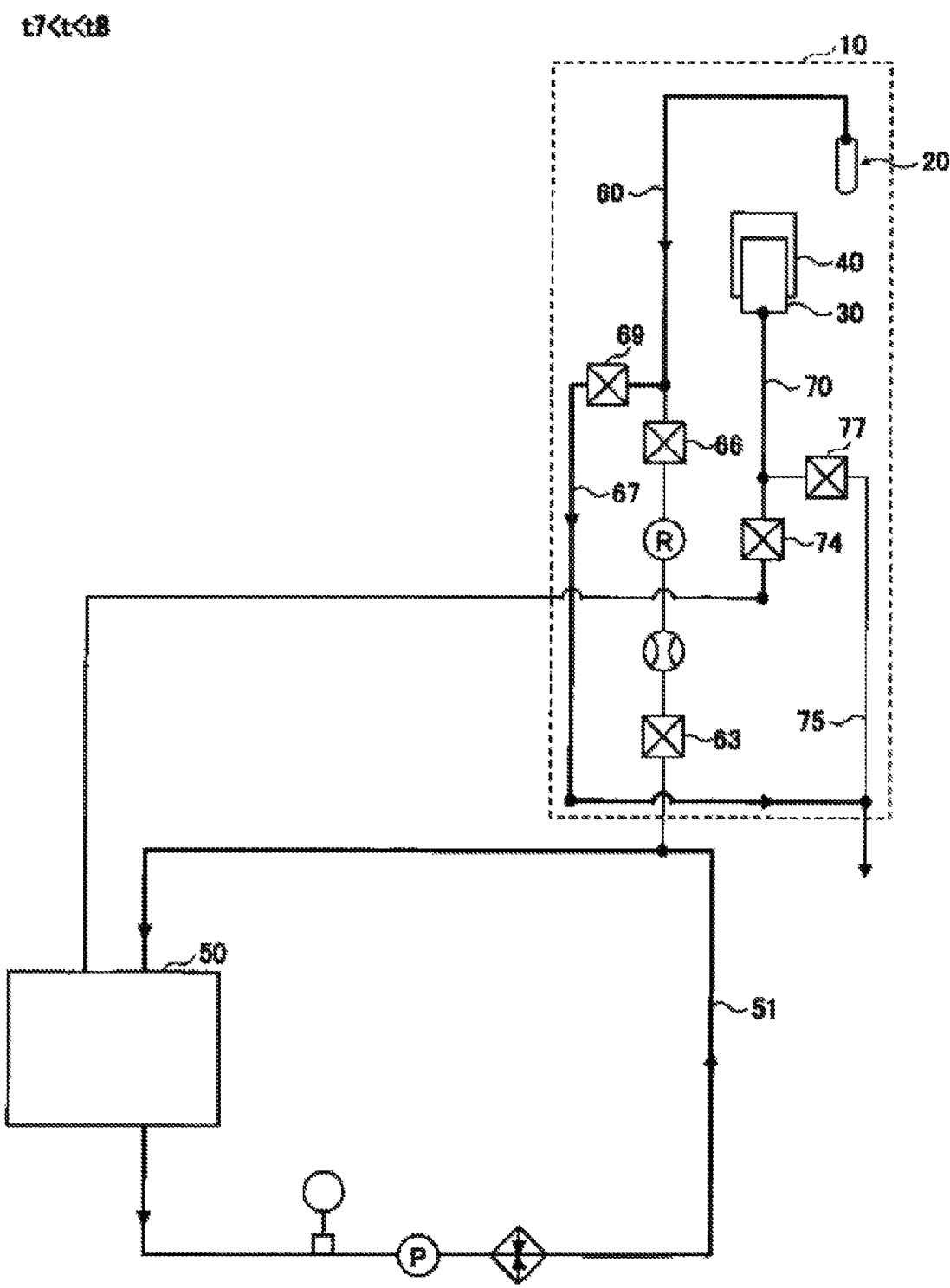
FIG. 10 is a view showing, by thick lines and arrows, the flow of the processing liquid after time t7 and before time t8 in FIG. 6 according to an embodiment.

FIG. 5 is a flowchart illustrating a substrate processing method according to an embodiment. FIG. 6 is a timing chart showing the operation of the substrate processing apparatus according to an embodiment. The operation of the substrate processing apparatus 1 shown in FIG. 6 is performed under the control of the control part 90. FIG. 7 is a view showing, by thick lines and arrows, the flow of the processing liquid after time t1 and before time t2 in FIG. 6 according to an embodiment. FIG. 8 is a view showing, by thick lines and arrows, the flow of the processing liquid after time t2 and before time t3 in FIG. 6 according to an embodiment. FIG. 9 is a view showing, by thick lines and arrows, the flow of the processing liquid after time t6 and before time t7 in FIG. 6 according to an embodiment. FIG. 10 is a view showing, by thick lines and arrows, the flow of the processing liquid after time t7 and before time t8 in FIG. 6 according to an embodiment.

The substrate processing method includes step S101 of returning the processing liquid 3, which is discharged from the nozzle 20 to the nozzle bath 30, to the nozzle 20 at a standby time at which the supply of the processing liquid 3 to the substrate 2 is interrupted (see FIG. 5). Hereinafter, step S101 will be also referred to as a circulation step S101. The circulation step S101 is performed, for example, from time t0 to time t1 shown in FIG. 6.

In the circulation step S101, the nozzle 20 is in the standby position, and the distal end portion 22 of the nozzle 20 is accommodated in the accommodation chamber 31 of the nozzle bath 30 to discharge the processing liquid 3. The processing liquid 3 discharged from the nozzle 20 to the nozzle bath 30 is returned to the nozzle 20 through the recovery line 70, the common recovery line 73, the tank 50, the first circulation line 51 and the supply line 60 as indicated by thick lines and arrows in FIG. 4.

In the circulation step S101, the first opening/closing valve 63 and the second opening/closing valve 66 open the flow path of the supply line 60, and the fourth opening/closing valve 74 opens the flow path of the recovery line 70. On the other hand, the third opening/closing valve 69 closes the flow path of the waste liquid line 67, and the fifth opening/closing valve 77 closes the flow path of the waste liquid line 75.

In the circulation step S101, the processing liquid 3 supplied from the tank 50 is discharged from the nozzle 20, and the processing liquid 3 discharged from the nozzle 20 is returned from the nozzle bath 30 to the tank 50. Therefore, it is possible to reduce a waste amount of the processing liquid 3 which is discarded without being returned to the tank 50.

In the circulation step S101, the expansion seal 82 expands to close the gap G formed between the nozzle bath 30 and the nozzle 20 accommodated in the accommodation chamber 31 of the nozzle bath 30. With this configuration, the gas present outside the nozzle bath 30 is restrained from flowing to the distal end portion 22 of the nozzle 20 accommodated in the accommodation chamber 31 of the nozzle bath 30, the gas present outside the nozzle bath 30 is restrained from making contact with the processing liquid 3 present inside the nozzle bath 30, and the vapor of the processing liquid 3 present inside the nozzle bath 30 is restrained from leaking out of the nozzle bath 30.

In the circulation step S101, both the suction nozzle 47 and the purge nozzle 48 are operated. That is to say, in the circulation step S101, the suction nozzle 47 discharges the gas from the intermediate chamber 41, and the purge nozzle 48 supplies the purge gas into the intermediate chamber 41, thereby suppressing a drop in air pressure of the intermediate chamber 41 and keeping the intermediate chamber 41 clean. In the circulation step S101, the operations of both the suction nozzle 47 and the purge nozzle 48 may be stopped.

The substrate processing method includes step S102 of making preparation for processing the substrate 2 with the processing liquid 3 after the circulation step S101 (see FIG. 5). Hereinafter, step S102 will be also referred to as a process preparation step S102. The process preparation step S102 is performed, for example, from time t1 to time t6 shown in FIG. 6.

In the process preparation step S102, first, at time t1, the first opening/closing valve 63 and the second opening/closing valve 66 close the flow path of the supply line 60. The supply of the processing liquid 3 from the supply line 60 to the nozzle 20 is stopped, and the discharge of the processing liquid 3 from the nozzle 20 is stopped.

The fourth opening/closing valve 74 opens the flow path of the recovery line 70 from time t1 to time t2, whereby the processing liquid 3 is returned from the recovery line 70 to the tank 50 as indicated by thick lines and arrows in FIG. 7. At time t2, the fourth opening/closing valve 74 closes the flow path of the recovery line 70. Since the closing of the flow path of the recovery line 70 is performed after the flow path of the supply line 60 is closed, it is possible to secure a reception space for the processing liquid 3 and to prevent an excessive rise in pressure of the processing liquid 3.

At time t2, the third opening/closing valve 69 opens the flow path of the waste fluid line 67, and at time t3, the third opening/closing valve 69 closes the flow path of the waste fluid line 67. From time t2 to time t3, the third opening/closing valve 69 opens the flow path of the waste liquid line 67, and the processing liquid 3 flows from the nozzle 20 to the waste liquid line 67 as indicated by thick lines and arrows in FIG. 8. The processing liquid 3 staying at the distal end portion 22 of the nozzle 20 can be discharged, and the dripping of the liquid from the distal end portion 22 of the nozzle 20 can be prevented. The processing liquid 3 may remain inside the nozzle 20 as long as it is possible to prevent the liquid dripping.

By the way, since the processing liquid 3 staying at the distal end portion 22 of the nozzle 20 is discharged during the time period from time t2 to time t3, a space is formed at the distal end portion 22 of the nozzle 20. In order to suppress the drop in the air pressure in the accommodation chamber 31 due to the formation of the space, the expansion seal 82 is contracted at time t2 to release the sealing of the gap G between the nozzle 20 and the nozzle bath 30. Furthermore, the purge nozzle 48 supplies a purge gas to the intermediate chamber 41 in order to suppress the drop in the air pressure of the accommodation chamber 31. The purpose of suppressing the drop in the air pressure in the accommodation chamber 31 is to suppress the inflow of an ambient air into the accommodation chamber 31.

Subsequently, from time t4 to time t5, the nozzle moving mechanism 28 moves the nozzle 20 from the standby position to the processing position. The distal end portion 22 of the nozzle 20 is withdrawn from the accommodation chamber 31 of the nozzle bath 30 and is moved to just above the central portion of the substrate 2 held by the substrate holder 13. The dripping of the liquid from the distal end portion 22 of the nozzle 20 is prevented in advance.

In order to make sure that the distal end portion 22 of the nozzle 20 can be withdrawn from the accommodation chamber 31 of the nozzle bath 30 at time t4, the expansion seal 82 is contracted prior to time t4 (at time t2 in FIG. 6) to release the sealing of the gap G between the nozzle 20 and the nozzle bath 30. This makes it possible to prevent the friction between the nozzle 20 and the expansion seal 82, thus preventing the generation of particles.

The substrate processing method includes step S103 of supplying the processing liquid 3 to the substrate 2 and processing the substrate 2 with the processing liquid 3 (see FIG. 5). Hereinafter, step S103 will be also referred to as a processing step S103. The processing step S103 is performed, for example, during the time period from time t6 to time t7 shown in FIG. 6.

In the processing step S103, the nozzle 20 is at the processing position where the nozzle 20 supplies the processing liquid 3 to the central portion of the substrate 2 which is rotating with the substrate holder 13. The processing liquid 3 supplied to the central portion of the rotating substrate 2 soaks and spreads over the entire upper surface of the substrate 2 by virtue of a centrifugal force and is dropped from the outer peripheral edge of the substrate 2. The dropped droplets of the processing liquid 3 are collected in the cup 25. In the processing step S103, the nozzle 20 may be moved between the position just above the central portion of the substrate 2 and the position just above the outer peripheral portion of the substrate 2.

In the processing step S103, the processing liquid 3 is supplied to the substrate 2 from the tank 50 through the first circulation line 51, the supply line 60 and the nozzle 20 as indicated by thick lines and arrows in FIG. 9. The first opening/closing valve 63 and the second opening/closing valve 66 open the flow path of the supply line 60. On the other hand, the third opening/closing valve 69 closes the flow path of the waste liquid line 67, the fourth opening/ closing valve 74 closes the flow path of the recovery line 70, and the fifth opening/closing valve 77 closes the flow path of the waste liquid line 75.

In the processing step S103, the movable lid 45 closes the entrance 42 of the outer bath 40. Furthermore, in the processing step S103, the suction nozzle 47 discharges a gas from the intermediate chamber 41, and the purge nozzle 48 supplies a purge gas to the intermediate chamber 41, thereby suppressing a drop in air pressure of the intermediate chamber 41 to keep the intermediate chamber 41 clean.

The substrate processing method includes step S104 of preparing the circulation step S101 after the processing step S103 (see FIG. 5). Hereinafter, step S104 will be also referred to as a circulation preparation step S104. The circulation preparation step S104 is performed, for example, during the time period from time t7 to time t13 shown in FIG. 6. After time t13, the circulation step S101 shown in FIG. 5 is performed again.

In the circulation preparation step S104, first, at time t7, the first opening/closing valve 63 and the second opening/closing valve 66 close the flow path of the supply line 60. The supply of the processing liquid 3 from the supply line 60 to the nozzle 20 is stopped, and the discharge of the processing liquid 3 from the nozzle 20 is stopped.

At time t7, the third opening/closing valve 69 opens the flow path of the waste liquid line 67. During the time period from time t7 to time t8, the third opening/closing valve 69 opens the flow path of the waste liquid line 67, and the processing liquid 3 flows from the nozzle 20 to the waste liquid line 67 as indicated by thick lines and arrows in FIG. 10. The processing liquid 3 staying at the distal end portion 22 of the nozzle 20 is discharged so that the dripping of the liquid from the distal end portion 22 of the nozzle 20 is prevented in advance. The processing liquid 3 may remain inside the nozzle 20 as long as it is possible to prevent the liquid dripping.

Subsequently, at time t8, the third opening/closing valve 69 closes the flow path of the waste liquid line 67.

Subsequently, during the time period from time t9 to time t10, the nozzle moving mechanism 28 moves the nozzle 20 from the processing position to the standby position. The dripping of the liquid from the distal end portion 22 of the nozzle 20 is prevented in advance. The distal end portion 22 of the nozzle 20 is moved outward from the inside of the cup 25 and is accommodated in the accommodation chamber 31 of the nozzle bath 30.

When the distal end portion 22 of the nozzle 20 is inserted into the accommodation chamber 31 of the nozzle bath 30, the expansion seal 82 is contracted and does not make contact with the outer circumferential surface 23 of the nozzle 20. This makes it possible to prevent the friction between the nozzle 20 and the expansion seal 82 at the time of moving the nozzle 20, thereby suppressing generation of particles.

Subsequently, at time t11, the expansion seal 82 is expanded radially inward and is pressed against the outer circumferential surface 23 of the nozzle 20. As a result, the expansion seal 82 seals the gap G formed between the nozzle 20 and the nozzle bath 30.

When the gap G between the nozzle 20 and the nozzle bath 30 is sealed, the suction nozzle 47 continuously discharges the gas from the intermediate chamber 41 outward of the processing chamber 12. Thus, the purge nozzle 48 continuously supplies the purge gas into the intermediate chamber 41 from the outside of the processing chamber 12.

Subsequently, at time t12, the fourth opening/closing valve 74 opens the flow path of the recovery line 70. Since the flow path of the recovery line 70 is opened prior to the opening of the flow path of the supply line 60, it is possible to secure a reception space for the processing liquid 3 when the flow path of the supply line 60 is opened. This makes it possible to prevent an excessive rise in the pressure of the processing liquid 3.

Thereafter, at time t13, the first opening/closing valve 63 and the second opening/closing valve 66 open the flow path of the supply line 60 to perform the circulation step S101 again.

Figure 11:
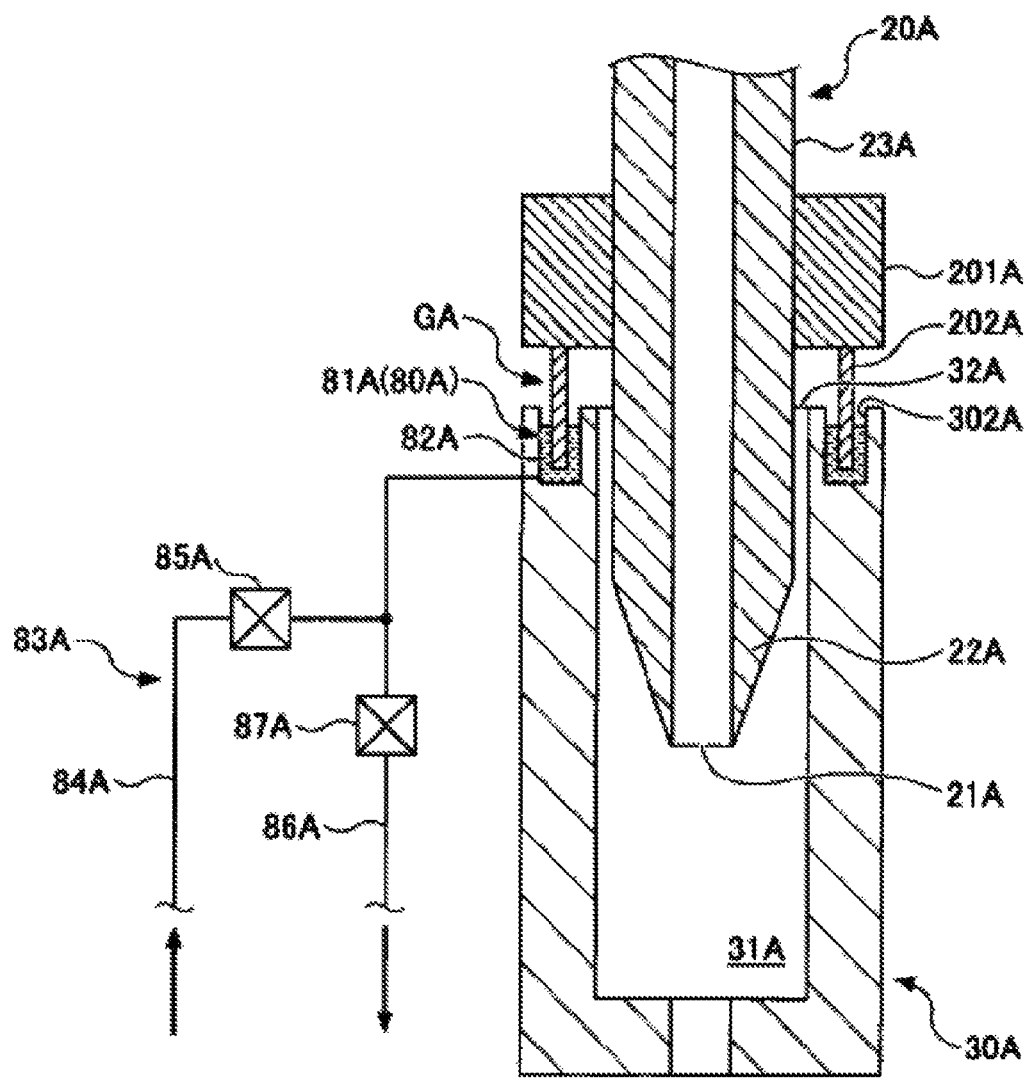
FIG. 11 is a view showing a nozzle, a nozzle bath and a first restraint part according to a first modification.

FIG. 11 is a view showing a nozzle, a nozzle bath and a first restraint part according to a first modification. Hereinafter, differences between a nozzle 20A, a nozzle bath 30A and a first restraint part 80A of the first modification and the nozzle 20, the nozzle bath 30 and the first restraint part 80 of the above embodiment will be mainly described.

The nozzle 20A has a discharge port 21A for the processing liquid 3 at a distal end portion 22A thereof. The distal end portion 22A is vertically disposed, and the discharge port 21A is formed in a lower surface of the distal end portion 22A. Furthermore, the nozzle 20A has a flange portion 201A protruding from an outer circumferential surface 23A thereof. A ring-shaped projection 202A larger in diameter than the entrance 32A of the nozzle bath 30A is formed on the lower surface of the flange portion 201A to face the nozzle bath 30A.

The number of ring-shaped projections 202A is not limited to one and may be plural. A plurality of projections 202A may be formed in a concentric relationship with each other.

The nozzle bath 30A internally defines an accommodation chamber 31A in which the distal end portion 22A of the nozzle 20A is accommodated. The processing chamber 12 is formed outside the nozzle bath 30A. In addition to the processing chamber 12, the intermediate chamber 41 may be formed outside the nozzle bath 30A. The nozzle bath 30A includes, in the upper surface thereof facing the flange portion 201A, the entrance 32A through which the distal end portion 22A of the nozzle 20A is inserted and pulled out, and a ring-shaped recess 302A surrounding the entrance 32A.

The number of ring-shaped recesses 302A is not limited to one and may be plural. A plurality of recesses 302A may be formed in a concentric relationship with each other.

The processing liquid 3 discharged from the nozzle 20A to the nozzle bath 30A is circulated by being returned to the nozzle 20A through the second circulation line 19 (see FIG. 4). During this circulation, a gap GA is formed between the nozzle bath 30A and the nozzle 20A accommodated in the accommodation chamber 31A of the nozzle bath 30A.

The gap GA is formed between a lower surface of the flange portion 201A of the nozzle 20A and the upper surface of the nozzle bath 30A. The gap GA is formed between the recess 302A and the projection 202A inserted into the recess 302A, thereby forming a labyrinth structure.

A first restraint part 80A includes a sealing part 81A that seals the gap GA during the circulation of the processing liquid 3. The sealing part 81A seals the gap GA to restrain a gas from flowing between the outside of the nozzle bath 30A and the processing liquid 3 present inside the nozzle bath 30A. By sealing the gap GA, the sealing part 81A restrains the gas present outside the nozzle bath 30A from flowing to the distal end portion 22A of the nozzle 20A accommodated in the accommodation chamber 31A of the nozzle bath 30A. By sealing the gap GA, the sealing part 81A restrains the gas present outside the nozzle bath 30A from making contact with the processing liquid 3 present inside the nozzle bath 30A. By sealing the gap GA, the sealing part 81A restrains the vapor of the processing liquid 3 present inside the nozzle bath 30A from leaking out of the nozzle bath 30A.

The sealing part 81A includes a seal formation part 83A that forms a liquid seal 82A for sealing the gap GA. The seal 82A is formed of, for example, a liquid such as DIW or the like. The liquid is supplied into the recess 302A. The liquid flows through the gap GA to seal the gap GA.

The seal formation part 83A includes a supply line 84A through which the liquid is supplied to the gap GA. An opening/closing valve 85A is provided in the supply line 84A. When the opening/closing valve 85A opens a flow path of the supply line 84A, the liquid is supplied into the gap GA to form the liquid seal 82A. On the other hand, when the opening/closing valve 85A closes the flow path of the supply line 84A, the supply of the liquid into the gap GA is stopped.

The timing of supplying the liquid into the gap GA is a time at which the nozzle 20A is located at the standby position after the movement of the nozzle 20A from the processing position to the standby position is completed. The gap GA is unsealed until the liquid seal 82A is formed and the nozzle 20A does not make contact with the nozzle bath 30A. It is therefore possible to prevent generation of particles and to suppress the particles from being mixed into the processing liquid 3.

The seal formation part 83A includes a suction line 86A through which the liquid is sucked from the gap GA. An opening/closing valve 87A is provided in the suction line 86A. When the opening/closing valve 87A opens a flow path of the suction line 86A, the liquid is sucked from the gap GA into the suction line 86A, whereby the liquid seal 82A is removed. On the other hand, when the opening/closing valve 87A closes the flow path of the suction line 86A, the suction of the liquid from the gap GA into the suction line 86A is stopped.

The timing of suctioning the liquid from the gap GA is a time at which the nozzle 20A is located at the standby position before the start of the movement of the nozzle 20A from the standby position to the processing position. Since the liquid seal 82A is removed before the start of the movement of the nozzle 20A, it is possible to prevent the dripping of the liquid from the nozzle 20A during the movement of the nozzle 20A.

Figure 12:
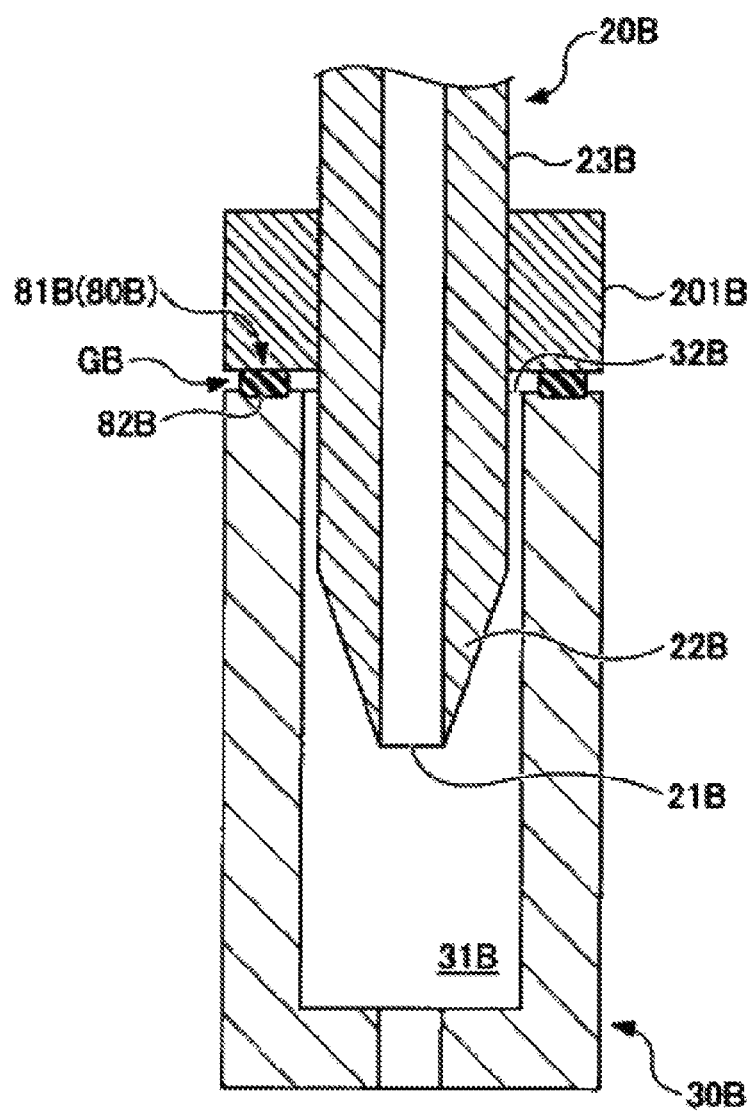
FIG. 12 is a view showing a nozzle, a nozzle bath and a first restraint part according to a second modification.

FIG. 12 is a view showing a nozzle, a nozzle bath and a first restraint part according to a second modification. Hereinafter, differences between a nozzle 20B, a nozzle bath 30B and a first restraint part 80B of the second modification and the nozzle 20, the nozzle bath 30 and the first restraint part 80 of the above embodiment will be mainly described.

The nozzle 20B has a discharge port 21B for the processing liquid 3 at a distal end portion 22B thereof. The distal end portion 22B is vertically disposed, and the discharge port 21B is formed in a lower surface of the distal end portion 22B. Furthermore, the nozzle 20B has a flange portion 201B that protrudes from an outer circumferential surface 23B. The flange portion 201B is formed to have a diameter larger than that of an entrance 32B of the nozzle bath 30B.

The nozzle bath 30B internally defines an accommodation chamber 31B in which the distal end portion 22B of the nozzle 20B is accommodated. The processing chamber 12 is formed outside the nozzle bath 30B. In addition to the processing chamber 12, the intermediate chamber 41 may be formed outside the nozzle bath 30B. The nozzle bath 30B has the entrance 32B formed in the upper surface thereof to face the flange portion 201B. The distal end portion 22B of the nozzle 20B is inserted into or pulled out from the entrance 32B.

The processing liquid 3 discharged from the nozzle 20B to the nozzle bath 30B is circulated by being returned to the nozzle 20B through the second circulation line 19 (see FIG. 4). During this circulation, a gap GB is formed between the nozzle bath 30B and the nozzle 20B accommodated in the accommodation chamber 31B of the nozzle bath 30B. The gap GB is formed between the lower surface of the flange portion 201B of the nozzle 20B and the upper surface of the nozzle bath 30B.

The first restraint part 80B includes a sealing part 81B that seals the gap GB during the circulation of the processing liquid 3. The sealing part 81B seals the gap GB to restrain a gas from flowing between the outside of the nozzle bath 30B and the processing liquid 3 present inside the nozzle bath 30B. By sealing the gap GB, the sealing part 81B restrains the gas present outside the nozzle bath 30B from flowing to the distal end portion 22B of the nozzle 20B accommodated in the accommodation chamber 31B of the nozzle bath 30B. By sealing the gap GB, the sealing part 81B restrains the gas present outside the nozzle bath 30B from making contact with the processing liquid 3 present inside the nozzle bath 30B. By sealing the gap GB, the sealing part 81B restrains the vapor of the processing liquid 3 present inside the nozzle bath 30B from leaking out of the nozzle bath 30B.

The sealing part 81B includes an elastic seal 82B which is compressed by the nozzle 20B and the nozzle bath 30B to seal the gap GB. Since the elastic seal 82B is compressed, the elastic seal 82B is pressed against both the nozzle 20B and the nozzle bath 30B by virtue of a restoration force thereof, thereby sealing the gap GB.

As the nozzle 20B moves downward, the elastic seal 82B is sandwiched and compressed between the lower surface of the flange portion 201B of the nozzle 20B and the upper surface of the nozzle bath 30B. Furthermore, as the nozzle 20B moves upward, the elastic seal 82B is released from the compression and is returned to its original shape by virtue of the restoration force. Since the gap GB can be sealed and unsealed by raising and lowering the nozzle 20B, it is possible to realize the sealing and unsealing of the gap GB with a simplified configuration.

The elastic seal 82B is fixed to, for example, the upper surface of the nozzle bath 30B and is disposed in a ring shape so as to surround the entrance 32B of the nozzle bath 30B. Therefore, when particles are generated due to the contact and separation of the elastic seal 82B and the nozzle 20B, the particles are held on the upper surface of the nozzle bath 30B. This makes it possible to suppress the drop of the particles from the entrance 32B on the upper surface of the nozzle bath 30B to the accommodation chamber 31B of the nozzle bath 30B and to suppress the particles from being mixed into the processing liquid 3. Even if particles are generated, such particles do not adhere to the nozzle 20B.

The number of elastic seals 82B is not limited to one and may be plural. A plurality of elastic seals 82B may be arranged in a concentric relationship with each other so as to surround the entrance 32B of the nozzle bath 30B.

Figure 13:
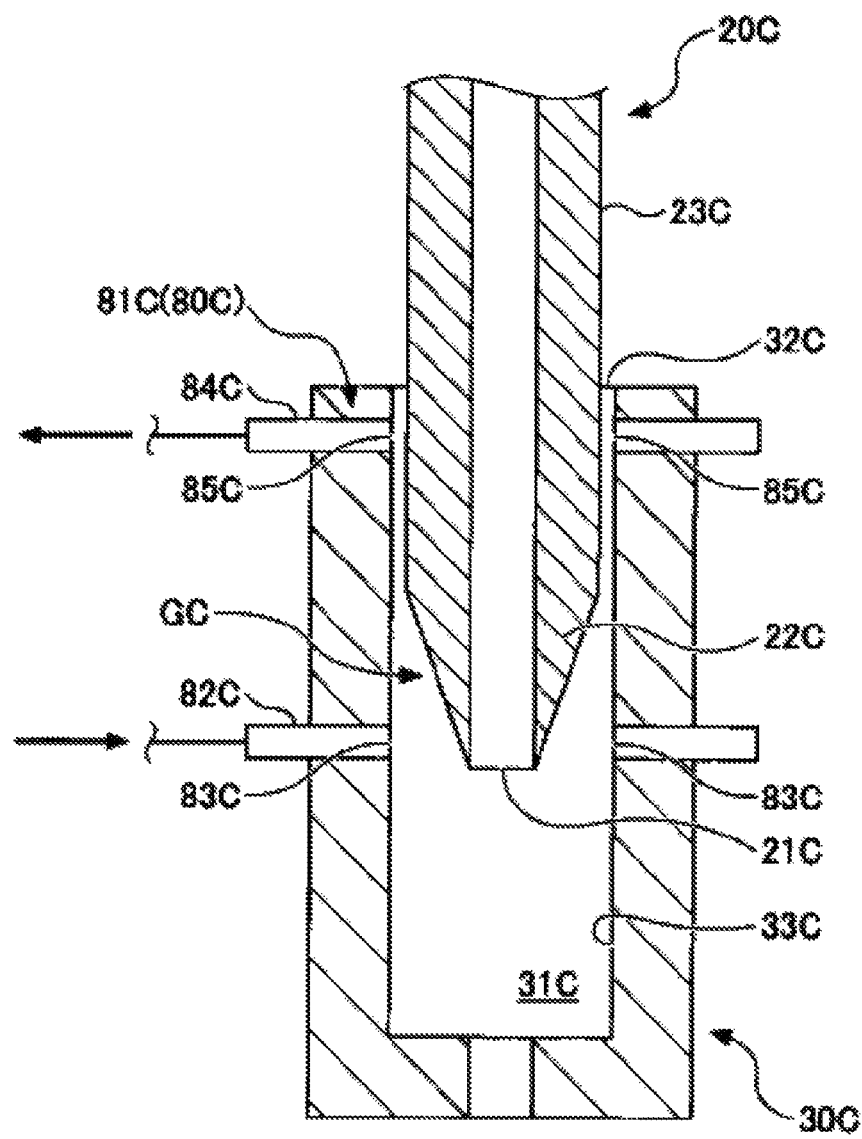
FIG. 13 is a view showing a nozzle, a nozzle bath and a first restraint part according to a third modification.

FIG. 13 is a view showing a nozzle, a nozzle bath and a first restraint part according to a third modification. Hereinafter, differences between a nozzle 20C, a nozzle bath 30C and a first restraint part 80C of the third modification and the nozzle 20, the nozzle bath 30 and the first restraint part 80 of the above embodiment will be mainly described.

The nozzle 20C has a discharge port 21C for the processing liquid 3 at a distal end portion 22C thereof. The distal end portion 22C is vertically disposed, and the discharge port 21C is formed in the lower surface of the distal end portion 22C.

The nozzle bath 30C internally defines an accommodation chamber 31C in which the distal end portion 22C of the nozzle 20C is accommodated. The processing chamber 12 is formed outside the nozzle bath 30C. In addition to the processing chamber 12, the intermediate chamber 41 may be formed outside the nozzle bath 30C. The nozzle bath 30C has an entrance 32C formed in the upper surface thereof. The distal end portion 22C of the nozzle 20C is inserted into or pulled out from the entrance 32C.

The processing liquid 3 discharged from the nozzle 20C to the nozzle bath 30C is circulated by being returned to the nozzle 20C through the second circulation line 19 (see FIG. 4). During this circulation, a gap GC is formed between the nozzle bath 30C and the nozzle 20C accommodated in the accommodation chamber 31C of the nozzle bath 30C. The gap GC is formed between an outer circumferential surface 23C of the nozzle 20C and an inner circumferential surface 33C of the nozzle bath 30C.

The first restraint part 80C includes a replacement part 81C that replaces atmosphere in the gap GC during the circulation of the processing liquid 3. The replacement part 81C replaces the atmosphere in the gap GC to restrain a gas from flowing between the outside of the nozzle bath 30C and the processing liquid 3 present inside the nozzle bath 30C. By replacing the atmosphere in the gap GC, the replacement part 81C restrains the gas present outside the nozzle bath 30C from flowing to the distal end portion 22C of the nozzle 20C accommodated in the accommodation chamber 31C of the nozzle bath 30C. By replacing the atmosphere in the gap GC, the replacement part 81C restrains the gas present outside the nozzle bath 30C from making contact with the processing liquid 3 present inside the nozzle bath 30C. By replacing the atmosphere in the gap GC, the replacement part 81C restrains the vapor of the processing liquid 3 present inside the nozzle bath 30C from leaking out of the nozzle bath 30C.

The replacement part 81C includes a gas supply part 82C that supplies a purge gas from the outside of the processing chamber 12 into the gap GC. A supply port 83C of the gas supply part 82C is formed in the inner circumferential surface 33C of the nozzle bath 30C. The supply port 83C of the gas supply part 82C may be formed in a ring shape so that the purge gas can be supplied into the gap GC from the entire circumferential region of the inner circumferential surface 33C of the nozzle bath 30C.

For example, an inert gas such as a nitrogen gas or the like is used as the purge gas supplied by the gas supply part 82C. Air or the like may be used instead of the inert gas. The purge gas may be any gas that does not react with the processing liquid 3 present in the accommodation chamber 31C of the nozzle bath 30C.

The replacement part 81C includes a gas suction part 84C that discharges a gas from the gap GC outward of the processing chamber 12. A suction port 85C of the gas suction part 84C is formed in the inner circumferential surface 33C of the nozzle bath 30C. The suction port 85C of the gas suction part 84C may be formed in a ring shape so that the gas present in the gap GC can be sucked from the entire circumferential region of the inner circumferential surface 33C of the nozzle bath 30C. The suction port 85C of the gas suction part 84C is disposed closer to the entrance 32C of the nozzle bath 30C than the supply port 83C of the gas supply part 82C.

The replacement part 81C replaces atmosphere in the gap GC by supplying the purge gas from the outside of the processing chamber 12 into the gap GC and discharging the gas from the gap GC outward of the processing chamber 12 during the circulation of the processing liquid 3. At this time, the gap GC is not sealed but is opened. Since the gap GC is opened and the nozzle 20C does not make contact with the nozzle bath 30C, it is possible to prevent generation of particles and to suppress the particles from being mixed into the processing liquid 3.

Figure 14:
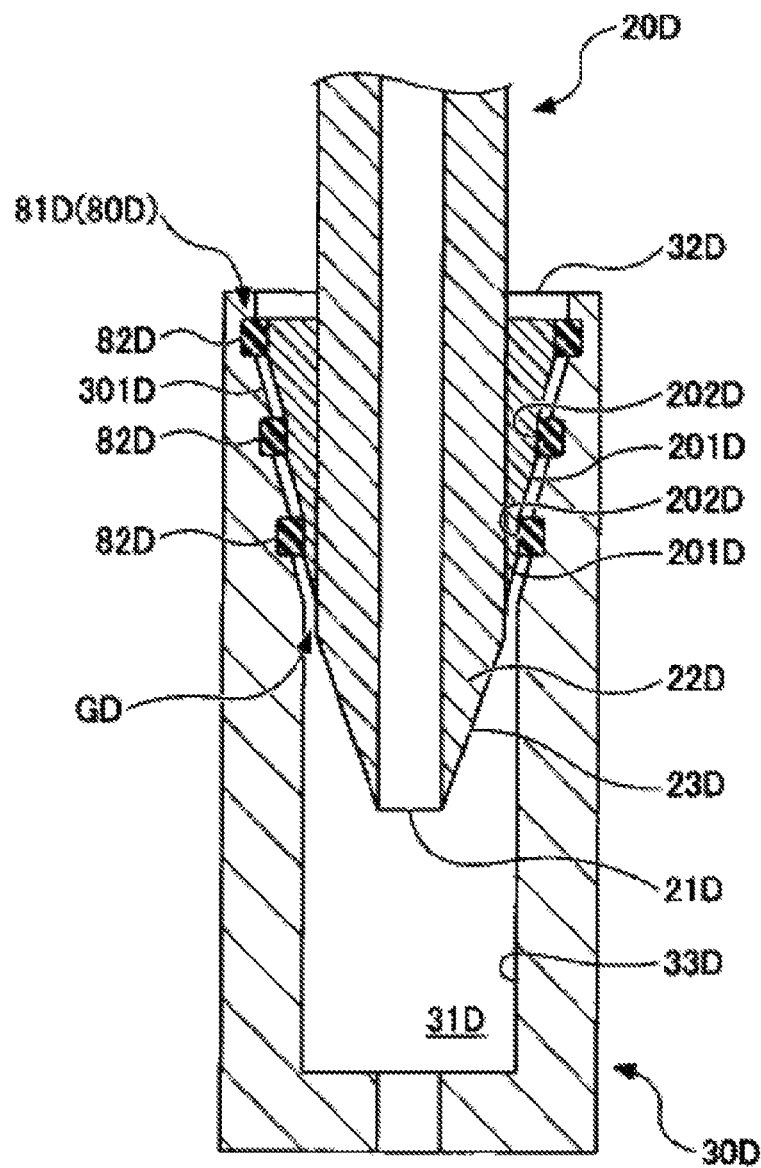
FIG. 14 is a view showing a nozzle, a nozzle bath and a first restraint portion according to a fourth modification.

FIG. 14 is a view showing a nozzle, a nozzle bath and a first restraint part according to a fourth modification. Hereinafter, differences between a nozzle 20D, a nozzle bath 30D and a first restraint part 80D of the fourth modification and the nozzle 20, the nozzle bath 30 and the first restraint part 80 of the above embodiment will be mainly described.

The nozzle 20D includes a discharge port 21D for the processing liquid 3 at a distal end portion 22D thereof. The distal end portion 22D is vertically disposed, and the discharge port 21D is formed in the lower surface of the distal end portion 22D. The nozzle 20D has, on an outer circumferential surface 23D thereof, tapered surfaces 201D whose outer diameter increases as it goes upward and cylindrical surfaces 202D whose outer diameter remains constant, wherein the tapered surfaces 201D and the cylindrical surfaces 202D are alternately disposed. The outer diameter of the upper cylindrical surface 202D is larger than that of the lower cylindrical surface 202D.

The nozzle bath 30D internally defines an accommodation chamber 31D in which the distal end portion 22D of the nozzle 20D is accommodated. The processing chamber 12 is formed outside the nozzle bath 30D. In addition to the processing chamber 12, the intermediate chamber 41 may be formed outside the nozzle bath 30D. The nozzle bath 30D has an entrance 32D formed in the upper surface thereof. The distal end portion 22D of the nozzle 20D is inserted into and pulled out from the entrance 32D. The nozzle bath 30D includes, on an inner circumferential surface 33D thereof, tapered surfaces 301D whose inner diameter increases as it goes upward.

The processing liquid 3 discharged from the nozzle 20D to the nozzle bath 30D is circulated by being returned to the nozzle 20D through the second circulation line 19 (see FIG. 4). During this circulation, a gap GD is formed between the nozzle bath 30D and the nozzle 20D accommodated in the accommodation chamber 31D of the nozzle bath 30D. The gap GD is formed between the outer circumferential surface 23D of the nozzle 20D and the inner circumferential surface 33D of the nozzle bath 30D.

The first restraint part 80D includes a sealing part 81D that seals the gap GD during the circulation of the processing liquid 3. The sealing part 81D seals the gap GD to restrain a gas from flowing between the outside of the nozzle bath 30D and the processing liquid 3 present inside the nozzle bath 30B. By sealing the gap GD, the sealing part 81D restrains the gas present outside the nozzle bath 30D from flowing to the distal end portion 22D of the nozzle 20D accommodated in the accommodation chamber 31D of the nozzle bath 30D. By sealing the gap GD, the sealing part 81D restrains the gas present outside the nozzle bath 30D from making contact with the processing liquid 3 present inside the nozzle bath 30D. By sealing the gap GD, the sealing part 81D restrains the vapor of the processing liquid 3 present inside the nozzle bath 30D from leaking out of the nozzle bath 30D.

The sealing part 81D includes elastic seals 82D which are compressed by the nozzle 20D and the nozzle bath 30D to seal the gap GD. Since the elastic seals 82D are compressed, the elastic seals 82D are pressed against both the nozzle 20D and the nozzle bath 30D by virtue of a restoration force, thereby sealing the gap GD.

As the nozzle 20D moves downward, the elastic seals 82D are sandwiched and compressed between the outer circumferential surface 23D of the nozzle 20D and the inner circumferential surface 33D of the nozzle bath 30D. Furthermore, as the nozzle 20D moves upward, the elastic seals 82D are released from the compression and are returned to their original shape by virtue of a restoration force. Since the gap GD can be sealed and unsealed by raising and lowering the nozzle 20D, it is possible to realize the sealing and unsealing of the gap GD with a simplified configuration.

The elastic seals 82D are fixed to the inner circumferential surface 33D of the nozzle bath 30D. During the downward movement of the nozzle 20D, the elastic seals 82D make contact with the cylindrical surfaces 202D of the outer circumferential surface 23D of the nozzle 20D. The elastic seals 82D are pressed radially outward of the cylindrical surfaces 202D by the cylindrical surfaces 202D. Since the restoration force of the elastic seals 82D acts in a direction orthogonal to the cylindrical surfaces 202D, it is possible to enhance the adhesion between the elastic seals 82D and the cylindrical surfaces 202D.

The elastic seals 82D are fixed to the inner circumferential surface 33D of the nozzle bath 30D and are arranged in a ring shape. The elastic seals 82D have different inner diameters. The inner diameter of the upper elastic seal 82D is larger than that of the lower elastic seal 82D. Therefore, it is possible to shorten a period of time during which the upper elastic seal 82D makes contact with the nozzle 20D during the downward movement of the nozzle 20D. This makes it possible to prevent generation of particles and to suppress the particles from being mixed into the processing liquid 3.

Although the embodiments of the substrate processing apparatus and the substrate processing method according to the present disclosure have been described above, the present disclosure is not limited to the above-described embodiments and the like. Various changes, modifications, substitutions, additions, deletions and combinations may be made within the scope of the claims. Of course, they also belong to the technical scope of the present disclosure.

For example, at least one of the plurality of sealing parts 81, 81A, 81B and 81D and the replacement part 81C may be used in combination. In addition, the expansion seal 82, the liquid seal 82A, the elastic seal 82B and the elastic seals 82D may be used in any combination.

According to the present disclosure in some embodiments, it is possible to reduce a waste amount of a processing liquid.

What is claimed is:

1. A substrate processing apparatus, comprising:
a processing chamber in which a substrate is processed with a processing liquid;
a nozzle having a discharge port from which the processing liquid is discharged, the discharge port being formed in a distal end portion of the nozzle;
a nozzle bath including an accommodation chamber formed in the nozzle bath and an entrance through which the nozzle is inserted into the nozzle bath and pulled out of the nozzle bath, wherein the distal end portion of the nozzle is accommodated in the accommodation chamber at a standby time at which the processing liquid is not supplied to the substrate;
a circulation line configured to connect the nozzle and the nozzle bath to each other;
a first gas flow restrainer configured to restrain a gas flow between an outside of the nozzle bath and an inside of the nozzle bath, and including an atmosphere replacer configured to replace an atmosphere in a gap formed between the nozzle bath and the nozzle accommodated in the accommodation chamber of the nozzle bath; and
a controller configured to control the substrate processing apparatus,
wherein the atmosphere replacer includes:
a supply port formed in an inner circumferential surface of the nozzle bath and configured to supply a purge gas from the outside of the processing chamber into the gap; and
a suction port formed in the inner circumferential surface of the nozzle bath at a location closer to the entrance of the nozzle bath than the supply port and configured to discharge a gas present in the gap outward of the processing chamber, and
wherein the controller is programmed to perform, during the standby time, a control to execute:
accommodating the distal end portion of the nozzle in the accommodation chamber;
circulating the processing liquid between the nozzle and the nozzle bath by discharging the processing liquid from the nozzle accommodated in the accommodation chamber to the nozzle bath and returning the processing liquid present inside the nozzle bath to the nozzle via the circulation line; and
while the distal end portion of the nozzle is accommodated in the accommodation chamber and the processing liquid is circulated, restraining the gas flow between the outside of the nozzle bath and the processing liquid present inside the nozzle bath by replacing the atmosphere in the gap by supplying the purge gas into the gap from the supply port and discharging the gas present in the gap from the suction port.

2. The apparatus of claim 1, wherein the first gas flow restrainer further includes a seal configured to seal the gap formed between the nozzle bath and the nozzle accommodated in the accommodation chamber of the nozzle bath.

3. The apparatus of claim 2, wherein the seal includes an expansion seal configured to expand by a fluid supplied thereinto and to seal the gap.

4. The apparatus of claim 2, wherein the seal includes an elastic seal configured to be compressed by the nozzle bath and the nozzle to seal the gap.

5. The apparatus of claim 2, wherein the seal includes a seal formation portion which forms a liquid seal for sealing the gap.

6. The apparatus of claim 2, further comprising:
an outer bath disposed outside the nozzle bath and including an intermediate chamber formed therein to surround the entrance of the nozzle bath; and
a second gas flow restrainer configured to restrain a gas flow between the outside of the outer bath and the inside of the nozzle bath.

7. The apparatus of claim 6, wherein the second gas flow restrainer includes a movable lid configured to open and close an entrance of the outer bath, wherein the nozzle is inserted into the outer bath and pulled out of the outer bath through the entrance of the outer bath.

8. The apparatus of claim 7, wherein the second gas flow restrainer further includes a suction nozzle configured to discharge a gas from the intermediate chamber outward of the processing chamber.

9. The apparatus of claim 8, wherein the second gas flow restrainer further includes a purge nozzle configured to supply a purge gas into the intermediate chamber from the outside of the processing chamber.

10. The apparatus of claim 1, wherein the supply port of the atmosphere replacer has a ring shape so that the purge gas is supplied into the gap from an entire circumferential region of the inner circumferential surface of the nozzle bath.

11. The apparatus of claim 1, wherein the suction port of the atmosphere replacer has a ring shape so that the gas present in the gap is suctioned from an entire circumferential region of the inner circumferential surface of the nozzle bath.

* * * * *